US012665393B2

(12) United States Patent
Maeda et al.

(10) Patent No.: US 12,665,393 B2
(45) Date of Patent: Jun. 23, 2026

(54) LIGHT-EMITTING APPARATUS AND MANUFACTURING METHOD THEREOF

(71) Applicant: SONY SEMICONDUCTOR SOLUTIONS CORPORATION, Kanagawa (JP)

(72) Inventors: Kensaku Maeda, Kanagawa (JP); Atsushi Yamamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 933 days.

(21) Appl. No.: 17/758,780

(22) PCT Filed: Dec. 7, 2020

(86) PCT No.: PCT/JP2020/045494
§ 371 (c)(1),
(2) Date: Jul. 13, 2022

(87) PCT Pub. No.: WO2021/149373
PCT Pub. Date: Jul. 29, 2021

(65) Prior Publication Data
US 2023/0039889 A1 Feb. 9, 2023

(30) Foreign Application Priority Data
Jan. 20, 2020 (JP) ................................. 2020-006929

(51) Int. Cl.
*H01S 5/42* (2006.01)
*H01S 5/02* (2006.01)
(Continued)

(52) U.S. Cl.
CPC ............ *H01S 5/423* (2013.01); *H01S 5/0206* (2013.01); *H01S 5/02253* (2021.01);
(Continued)

(58) Field of Classification Search
CPC ... H01S 5/18305; H01S 5/18388; H01S 5/423
See application file for complete search history.

(56) References Cited

U.S. PATENT DOCUMENTS 11,095,365 B2 * 8/2021 Dacha ..................... H01S 5/423
2002/0167485 A1 11/2002 Hedrick
(Continued)

FOREIGN PATENT DOCUMENTS

CN 1732403 A 2/2006
CN 1761549 A 4/2006
(Continued)

OTHER PUBLICATIONS

Schift Helmut Ed—Genin Fy: "Nanoimprint lithography: 2D or not 2D? A review", Applied Physics A, Apr. 1, 2015 (Apr. 1, 2015), vol. 121, No. 2, pp. 415-435, Springer Berlin Heidelberg, Berlin/Heidelberg.

(Continued)

*Primary Examiner* — Michael Carter
(74) *Attorney, Agent, or Firm* — CHIP LAW GROUP

(57) ABSTRACT

To provide a light-emitting apparatus capable of shaping light from a plurality of light-emitting elements into light with a plurality of shapes and a manufacturing method thereof. A light-emitting apparatus according to the present disclosure, including: a substrate; a plurality of light-emitting elements which are provided on a side of a first surface of the substrate; and a plurality of first lenses which are provided on a side of a second surface of the substrate and on which light emitted from the plurality of light-emitting elements is incident, wherein the plurality of first lenses include at least two types of lenses among a concave lens, a convex lens, and a flat lens.

24 Claims, 18 Drawing Sheets

(51) Int. Cl.

| | |
|---|---|
| *H01S 5/02253* | (2021.01) |
| *H01S 5/042* | (2006.01) |
| *H01S 5/183* | (2006.01) |
| *G01S 7/481* | (2006.01) |

(52) U.S. Cl.

CPC .......... *H01S 5/042* (2013.01); *H01S 5/18388* (2013.01); *G01S 7/4815* (2013.01); *H01S 5/18305* (2013.01)

(56) References Cited

U.S. PATENT DOCUMENTS

| | | | | |
|---|---|---|---|---|
| 2011/0317727 A1* | 12/2011 | Furuya | .................... | H01S 3/109 |
| | | | | 372/27 |
| 2012/0300431 A1 | 11/2012 | You et al. | | |
| 2017/0219743 A1* | 8/2017 | Miller | ................. | H01S 5/02355 |
| 2020/0169065 A1* | 5/2020 | Carson | .................... | H01S 5/423 |
| 2020/0194973 A1* | 6/2020 | Bloemen | ............. | H01S 5/18388 |
| 2020/0251882 A1* | 8/2020 | Lyon | .................. | G02B 27/0922 |
| 2020/0278426 A1* | 9/2020 | Dummer | ............... | H01S 5/0264 |
| 2021/0057889 A1* | 2/2021 | O'Daniel | ............ | H01S 5/18305 |
| 2023/0006417 A1* | 1/2023 | Von Malm | ........... | G01S 7/4814 |

FOREIGN PATENT DOCUMENTS

| | | | |
|---|---|---|---|
| CN | 1813358 | A | 8/2006 |
| CN | 102736384 | A | 10/2012 |
| CN | 102800790 | A | 11/2012 |
| CN | 103828042 | A | 5/2014 |
| CN | 104253238 | A | 12/2014 |
| CN | 106154633 | A | 11/2016 |
| CN | 108826229 | A | 11/2018 |
| CN | 110244492 | A | 9/2019 |
| CN | 111418074 | A | 7/2020 |
| EP | 3561553 | A1 | 10/2019 |
| JP | H09320099 | A | 12/1997 |
| JP | 2001208902 | A | 8/2001 |
| JP | 2004-526194 | A | 8/2004 |
| JP | 2012002888 | A | 1/2012 |
| JP | 2014-086558 | A | 5/2014 |
| JP | 2014089228 | A | 5/2014 |
| JP | 2017-227860 | A | 12/2017 |
| JP | 2019165198 | A | 9/2019 |
| JP | 2019-192888 | A | 10/2019 |
| KR | 20090085898 | A | 8/2009 |
| KR | 20110032491 | A | 3/2011 |
| KR | 20130003844 | A | 1/2013 |
| KR | 20170142196 | A | 12/2017 |
| WO | WO-2018232410 | A1 | 12/2018 |
| WO | WO-2019036383 | A1 | 2/2019 |

OTHER PUBLICATIONS

International Search Report and Written Opinion of PCT Application No. PCT/JP2020/045494, issued on Feb. 2, 2021, 10 pages of ISRWO.

* cited by examiner

Fig. 15A
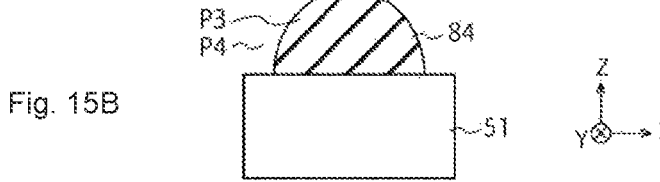
Fig. 15B
Fig. 15C
Fig. 15D
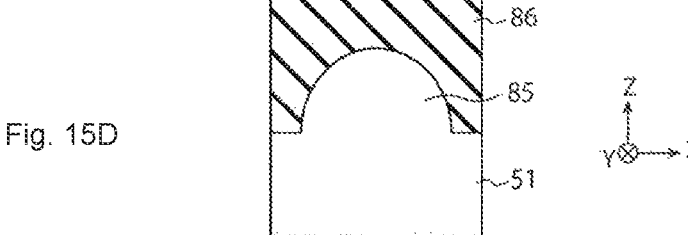

Fig. 18A
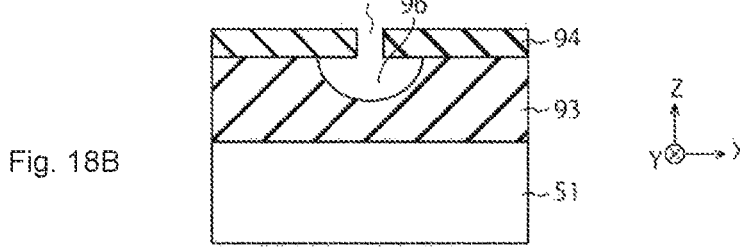
Fig. 18B
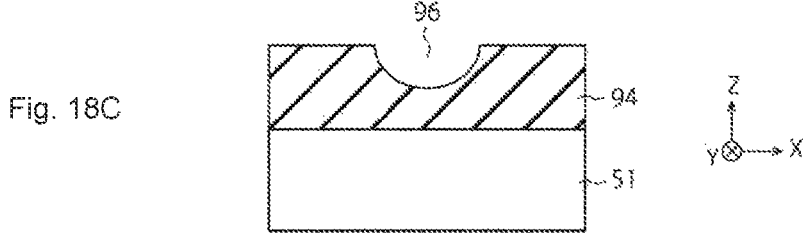
Fig. 18C
Fig. 18D

LIGHT-EMITTING APPARATUS AND MANUFACTURING METHOD THEREOF

CROSS REFERENCE TO RELATED APPLICATIONS

This application is a U.S. National Phase of International Patent Application No. PCT/JP2020/045494 filed on Dec. 7, 2020, which claims priority benefit of Japanese Patent Application No. JP 2020-006929 filed in the Japan Patent Office on Jan. 20, 2020. Each of the above-referenced applications is hereby incorporated herein by reference in its entirety.

TECHNICAL FIELD

The present disclosure relates to a light-emitting apparatus and to a manufacturing method thereof.

BACKGROUND ART

Surface-emitting lasers such as a VCSEL (Vertical Cavity Surface Emitting Laser) are known as a type of semiconductor laser. Generally, in a light-emitting apparatus using a surface-emitting laser, a plurality of light-emitting elements are provided in a two-dimensional array pattern on a front surface or a rear surface of a substrate.

CITATION LIST

Patent Literature

[PTL 1]
JP 2004-526194 T

SUMMARY

Technical Problem

In a light-emitting apparatus such as that described above, for example, light emitted from the plurality of light-emitting elements must be shaped into light with shapes which differ according to use applications. In this case, determining a method of shaping the light into light of various shapes is an important issue.

In consideration thereof, the present disclosure provides a light-emitting apparatus capable of shaping light from a plurality of light-emitting elements into light with a plurality of shapes and a manufacturing method thereof.

Solution to Problem

A light-emitting apparatus according to a first aspect of the present disclosure includes: a substrate; a plurality of light-emitting elements which are provided on a side of a first surface of the substrate; and a plurality of first lenses which are provided on a side of a second surface of the substrate and on which light emitted from the plurality of light-emitting elements is incident, wherein the plurality of first lenses include at least two types of lenses among a concave lens, a convex lens, and a flat lens. Accordingly, light from the plurality of light-emitting elements can be shaped into light with a plurality of shapes and, for example, light from the plurality of light-emitting elements can be shaped into light for a dot projector by the concave lens or light for a flood illuminator by the convex lens.

In addition, the light-emitting apparatus according to the first aspect may further include a second lens on which light having passed through the plurality of first lenses is incident. Accordingly, light from the plurality of light-emitting elements can be individually shaped by the first lenses and collectively shaped by the second lens.

Furthermore, in the first aspect, the plurality of first lenses may be provided on the second surface of the substrate as a part of the substrate. Accordingly, the first lenses can be readily formed by machining of the substrate.

Moreover, in the first aspect, the plurality of light-emitting elements and the plurality of first lenses may correspond to each other one-to-one, and light emitted from each light-emitting element may be incident on a single corresponding first lens. Accordingly, light from the plurality of light-emitting elements can be shaped for each individual light-emitting element.

In addition, the light-emitting apparatus according to the first aspect may further include a film which is provided on a surface of the concave lens and which has a flat or a convex surface on an opposite side to the concave lens. Accordingly, for example, light emitted from the concave lens can be further shaped.

Furthermore, the light-emitting apparatus according to the first aspect may further include a film which is provided on a surface of the convex lens and which has a flat surface on an opposite side to the convex lens. Accordingly, for example, light emitted from the convex lens can be further shaped.

Furthermore, the light-emitting apparatus according to the first aspect may further include an antireflective film which is provided on a surface of the plurality of first lenses. Accordingly, light can be prevented from being reflected by the first lenses.

Moreover, the light-emitting apparatus according to the first aspect may further include an inorganic film provided on the second surface of the substrate between the plurality of first lenses. Accordingly, for example, light can be prevented from passing through portions other than the first lenses.

In addition, in the first aspect, the substrate may be a semiconductor substrate containing gallium (Ga) and arsenic (As). Accordingly, a substrate suitable for a light-emitting apparatus can be provided.

Furthermore, in the first aspect, light emitted from the plurality of light-emitting elements may be transmitted inside the substrate from the first surface to the second surface and may be incident on the plurality of first lenses. Accordingly, a structure can be realized in which light is transmitted through the substrate and emitted from the light-emitting apparatus.

Moreover, in the first aspect, the first surface of the substrate may be a front surface of the substrate and the second surface of the substrate may be a rear surface of the substrate. Accordingly, a backside illumination-type light-emitting apparatus can be provided.

In addition, the light-emitting apparatus according to the first aspect may further include a drive apparatus which is provided on the side of the first surface of the substrate via the plurality of light-emitting elements and which is configured to drive the plurality of light-emitting elements. Accordingly, for example, the substrate provided with the light-emitting elements can be loaded onto the drive apparatus.

Furthermore, in the first aspect, the drive apparatus may be configured to drive the plurality of light-emitting elements on an individual basis. Accordingly, light emitted from the plurality of light-emitting elements can be controlled more precisely.

A light-emitting apparatus according to a second aspect of the present disclosure includes: a substrate; a plurality of light-emitting elements which are provided on a side of a first surface of the substrate; and a plurality of first lenses which are provided on a side of a second surface of the substrate and on which light emitted from the plurality of light-emitting elements is incident, wherein the plurality of first lenses include a first concave lens and a second concave lens with a shape that differs from that of the first concave lens or include a first convex lens and a second convex lens with a shape that differs from that of the first convex lens. Accordingly, light from the plurality of light-emitting elements can be shaped into light with a plurality of shapes.

A manufacturing method of a light-emitting apparatus according to a third aspect of the present disclosure includes the steps of forming a plurality of light-emitting elements on a side of a first surface of a substrate; and forming a plurality of first lenses on which light emitted from the plurality of light-emitting elements is incident on a side of a second surface of the substrate, wherein the plurality of first lenses include at least two types of lenses among a concave lens, a convex lens, and a flat lens. Accordingly, light from the plurality of light-emitting elements can be shaped into light with a plurality of shapes and, for example, light from the plurality of light-emitting elements can be shaped into light for a dot projector by the concave lens or light for a flood illuminator by the convex lens.

In addition, the manufacturing method of a light-emitting apparatus according to the third aspect may further include the step of arranging a second lens on which light having passed through the plurality of first lenses is incident. Accordingly, light from the plurality of light-emitting elements can be individually shaped by the first lenses and collectively shaped by the second lens.

Furthermore, in the third aspect, the plurality of first lenses may be formed as a part of the substrate by machining the second surface of the substrate. Accordingly, the first lenses can be readily formed by machining of the substrate.

Moreover, in the third aspect, the concave lens may be formed by forming a convex portion on the second surface of the substrate and machining the convex portion into a concave portion. Accordingly, the concave lens can be formed by machining from the convex portion to the concave portion.

In addition, in the third aspect, the convex portion may be formed by forming a resist film on the second surface of the substrate, patterning the resist film, baking the patterned resist film, and transferring a pattern of the baked resist film to the substrate. Accordingly, a convex portion which enables a concave lens to be formed can be formed through machining of the resist film.

Furthermore, in the third aspect, the concave portion may be formed by forming a mask layer on the convex portion, exposing the convex portion from the mask layer by etching the mask layer, and further etching the mask layer together with the convex portion. Accordingly, a concave portion can be readily formed from a convex portion.

Moreover, in the third aspect, the convex lens may be formed by forming a convex portion on the second surface of the substrate. Accordingly, for example, the convex lens can be formed by a small number of steps.

In addition, in the third aspect, the convex portion may be formed by forming a resist film on the second surface of the substrate, patterning the resist film, baking the patterned resist film, and transferring a pattern of the baked resist film to the substrate. Accordingly, the convex lens can be formed through machining of a resist film.

Furthermore, in the third aspect, the concave lens and the convex lens may be formed by forming a film including a concave portion and a convex portion on the substrate and transferring the concave portion and the convex portion to the substrate. Accordingly, the concave lens and the convex lens can be formed at the same time.

A manufacturing method of a light-emitting apparatus according to a fourth aspect of the present disclosure includes the steps of forming a plurality of light-emitting elements on a side of a first surface of a substrate; and forming a plurality of first lenses on which light emitted from the plurality of light-emitting elements is incident on a side of a second surface of the substrate, wherein the plurality of first lenses include a first concave lens and a second concave lens with a shape that differs from that of the first concave lens or include a first convex lens and a second convex lens with a shape that differs from that of the first convex lens. Accordingly, light from the plurality of light-emitting elements can be shaped into light with a plurality of shapes.

BRIEF DESCRIPTION OF DRAWINGS

FIGS. 7A and 7B are sectional views showing a structure of a light-emitting apparatus according to a modification of the first embodiment.

FIGS. 11A and 11B are sectional views showing a structure of a light-emitting apparatus according to another modification of the first embodiment.

FIGS. 15A, 15B, 15C, and 15D are sectional views (1/2) for explaining details of a step shown in A in-FIG. 14A.

FIGS. 16A, 16B, 16C, and 16D are sectional views (2/2) for explaining details of the step shown in A in FIG. 14A.

FIGS. 17A and 17B are sectional views showing a method 1 which differs from a method shown from FIGS. 15A, 15B, 15C, 15D, 16A, 16B, 16C, and 16D.

FIGS. 18A, 18B, 18C, and 18D is a are sectional views showing a method 2 which differs from the method shown from FIGS. 15A, 15B, 15C, 15D, 16A, 16B, 16C, and 16D.

DESCRIPTION OF EMBODIMENTS

Hereinafter, embodiments of the present invention will be described with reference to drawings.

First Embodiment

Figure 1:
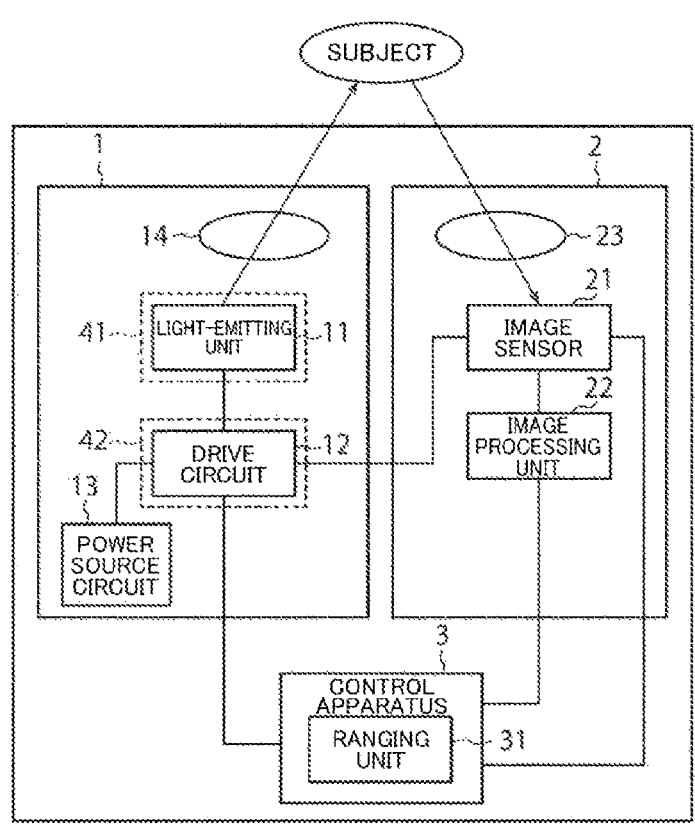
FIG. 1 is a block diagram showing a configuration of a ranging apparatus according to a first embodiment.

FIG. 1 is a block diagram showing a configuration of a ranging apparatus according to a first embodiment.

The ranging apparatus shown in FIG. 1 includes a light-emitting apparatus 1, an imaging apparatus 2, and a control apparatus 3. The ranging apparatus shown in FIG. 1 irradiates a subject with light emitted from the light-emitting apparatus 1, images the subject by receiving, with the imaging apparatus 2, light reflected by the subject, and measures (calculates) a distance to the subject with the control apparatus 3 using an image signal output from the imaging apparatus 2. The light-emitting apparatus 1 functions as a light source used when the imaging apparatus 2 images a subject.

The light-emitting apparatus 1 includes a light-emitting unit 11, a drive circuit 12, a power source circuit 13, and a light-emitting side optical system 14. The imaging apparatus 2 includes an image sensor 21, an image processing unit 22, and an imaging-side optical system 23. The control apparatus 3 includes a ranging unit 31.

The light-emitting unit 11 emits laser light with which the subject is to be irradiated. As will be described later, the light-emitting unit 11 according to the present embodiment includes a plurality of light-emitting elements arranged in a two-dimensional array pattern and each light-emitting element has a VCSEL structure. The subject is to be irradiated with light emitted from the light-emitting elements. In addition, the light-emitting unit 11 according to the present embodiment is provided inside a chip referred to as an LD (Laser Diode) chip 41.

The drive circuit 12 is an electrical circuit for driving the light-emitting unit 11. The power source circuit 13 is an electrical circuit for generating power supply voltage of the drive circuit 12. For example, the ranging apparatus according to the present embodiment generates power supply voltage with the power source circuit 13 from input voltage supplied from a battery inside the ranging apparatus and drives the light-emitting unit 11 with the drive circuit 12 using the power supply voltage. In addition, the drive circuit 12 according to the present embodiment is provided inside a substrate referred to as an LDD (Laser Diode Driver) substrate 42.

The light-emitting side optical system 14 includes various optical elements and irradiates the subject with light from the light-emitting unit 11 via the optical elements. In a similar manner, the imaging-side optical system 23 includes various optical elements and receives light from the subject via the optical elements.

The image sensor 21 receives light from the subject via the imaging-side optical system 23 and converts the light into an electric signal by photoelectric conversion. For example, the image sensor 21 is a CCD (Charge Coupled Device) sensor or a CMOS (Complementary Metal Oxide Semiconductor) sensor. The image sensor 21 according to the present embodiment converts the electronic signal described above into a digital signal from an analog signal by A/D (Analog to Digital) conversion and outputs an image signal as a digital signal to the image processing unit 22. In addition, the image sensor 21 according to the present embodiment outputs a frame synchronization signal to the drive circuit 12 and, based on the frame synchronization signal, the drive circuit 12 causes the light-emitting unit 11 to emit light at a timing in accordance with a frame period in the image sensor 21.

The image processing unit 22 performs various types of image processing on the image signal output from the image sensor 21. For example, the image processing unit 22 includes an image processing processor such as a DSP (Digital Signal Processor).

The control apparatus 3 controls various operations of the ranging apparatus shown in FIG. 1 such as a light emission operation of the light-emitting apparatus 1 and an imaging operation of the imaging apparatus 2. For example, the control apparatus 3 includes a CPU (Central Processing Unit), a ROM (Read Only Memory), a RAM (Random Access Memory), and the like.

The ranging unit 31 measures a distance to the subject based on an image signal which is output from the image sensor 21 and on which image processing has been performed by the image processing unit 22. As a ranging method, for example, the ranging unit 31 adopts an STL (Structured Light) method or a ToF (Time of Flight) method. The ranging unit 31 may further specify a three-dimensional shape of the subject by measuring, based on the image signal described above, a distance between the ranging apparatus and the subject for each portion of the subject.

Figures 2A, 2B:
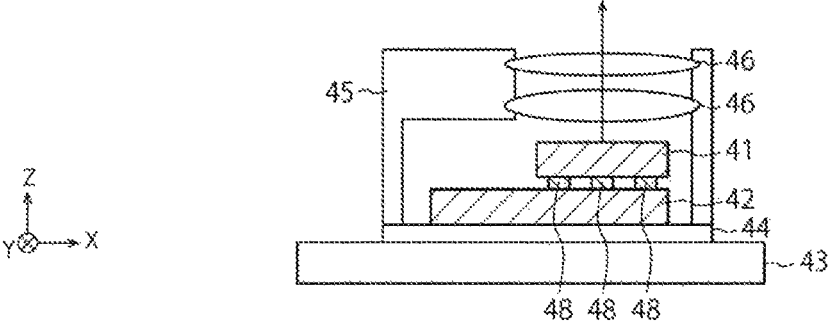
FIGS. 2A and 2B are sectional views showing an example of a structure of the ranging apparatus according to the first embodiment.

FIGS. 2A and 2B are sectional views showing an example of a structure of the ranging apparatus according to the first embodiment.

FIG. 2A shows a first example of the structure of the ranging apparatus according to the first embodiment. The ranging apparatus according to the example includes the LD chip 41 and the LDD substrate 42 described above, a mounting substrate 43, a heat dissipation substrate 44, a correcting lens holding unit 45, one or more correcting lenses 46, and wiring 47.

FIG. 2A shows an X axis, a Y axis, and a Z axis which are perpendicular to each other. An X direction and a Y direction correspond to a lateral direction (horizontal direction) and a Z direction corresponds to a longitudinal direction (a perpendicular direction). In addition, a +Z direction corresponds to an upward direction and a −Z direction corresponds to a downward direction. The −Z direction may strictly coincide with the direction of gravitational force or may not strictly coincide with the direction of gravitational force.

The LD chip 41 is arranged on the mounting substrate 43 via the heat dissipation substrate 44 and the LDD substrate 42 is also arranged on the mounting substrate 43. The mounting substrate 43 is, for example, a printed circuit board. The image sensor 21 and the image processing unit 22 shown in FIG. 1 are also arranged on the mounting substrate 43 according to the present embodiment. The heat dissipation substrate 44 is, for example, a ceramic substrate such as an AlN (aluminum nitride) substrate.

The correcting lens holding unit 45 is arranged on the heat dissipation substrate 44 so as to surround the LD chip 41 and holds one or more correcting lenses 46 above the LD chip 41. The correcting lenses 46 are included in the light-emitting side optical system 14 (FIG. 1) described above. Light emitted from the light-emitting unit 11 (FIG. 1) inside the LD chip 41 is corrected by the correcting lenses 46 and, subsequently, the subject (FIG. 1) is irradiated with the corrected light. As an example, FIG. 2A shows two correcting lenses 46 held by the correcting lens holding unit 45.

The wiring 47 is provided on a front surface and a rear surface of the mounting substrate 41, provided inside the mounting substrate 41, and the like and electrically connects the LD chip 41 and the LDD substrate 42 to each other. The wiring 47 is, for example, printed wiring which is provided on the front surface and the rear surface of the mounting substrate 41 or via wiring which penetrates the mounting substrate 41. The wiring 47 according to the present embodiment further passes inside or near the heat dissipation substrate 44.

B in FIG. 2 shows a second example of the structure of the ranging apparatus according to the first embodiment. While the ranging apparatus according to the second example includes the same components as the ranging apparatus according to the first example, the ranging apparatus according to the second example includes a bump 48 instead of the wiring 47.

FIG. 2B shows a second example of the structure of the ranging apparatus according to the first embodiment. While the ranging apparatus according to the second example includes the same components as the ranging apparatus according to the first example, the ranging apparatus according to the second example includes a bump 48 instead of the wiring 47.

In FIG. 2B, the LDD substrate 42 is arranged on the heat dissipation substrate 44 and the LD chip 41 is arranged on the LDD substrate 42. By arranging the LD chip 41 on the LDD substrate 42 in this manner, the mounting substrate 44 can be downsized as compared to the first example. In FIG. 2B, the LD chip 41 is arranged on the LDD substrate 42 via the bump 48 and the LD chip 41 is electrically connected to the LDD substrate 42 by the bump 48.

Hereinafter, the ranging apparatus according to the present embodiment will be described on the assumption that the ranging apparatus has the structure according to the second example shown in FIG. 2B. However, with the exception of an explanation of structures specific to the second example, the following explanation is also applicable to a ranging apparatus having the structure according to the first example.

Figure 3:
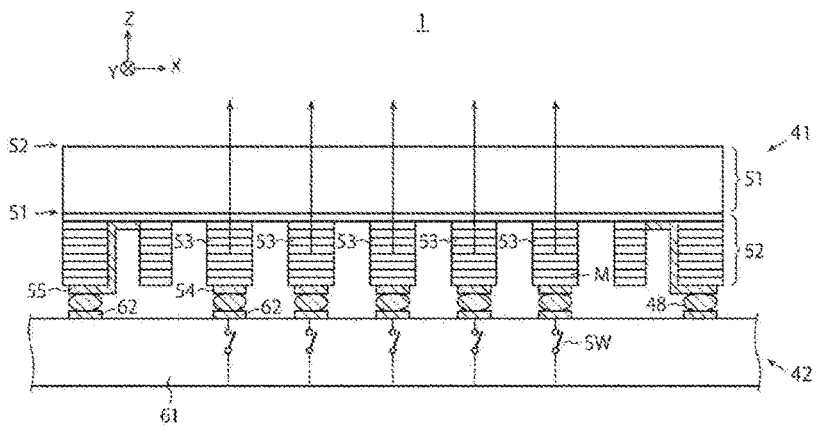
FIG. 3 is a sectional view showing the structure of the ranging apparatus shown in FIG. 2B.

FIG. 3 is a sectional view showing the structure of the ranging apparatus shown in FIG. 2B.

FIG. 3 shows cross sections of the LD chip 41 and the LDD substrate 42 inside the light-emitting apparatus 1. As shown in FIG. 3, the LD chip 41 includes a substrate 51, a laminated film 52, a plurality of light-emitting elements 53, a plurality of anode electrodes 54, and a plurality of cathode electrodes 55. In addition, the LDD substrate 42 includes a substrate 61 and a plurality of connection pads 62. In FIG. 3, illustration of a concave lens 71, a convex lens 72, and a flat lens 73 (to be described later) has been omitted (refer to FIG. 4).

The substrate 51 is a semiconductor substrate such as a GaAs (gallium arsenide) substrate. FIG. 3 shows a front surface S1 of the substrate 51 facing the −Z direction and a rear surface S2 of the substrate 51 facing the +Z direction. The front surface S1 is an example of the first surface according to the present disclosure. The rear surface S2 is an example of the second surface according to the present disclosure.

The laminated film 52 includes a plurality of layers laminated on the front surface S1 of the substrate 51. Examples of the layers include an n-type semiconductor layer, an active layer, a p-type semiconductor layer, a light reflection layer, and an insulating layer having a light emission window. The laminated film 52 includes a plurality of mesa portions M which protrude in the −Z direction. A part of the mesa portions M constitutes the plurality of light-emitting elements 53.

The plurality of light-emitting elements 53 are provided on the side of the front surface S1 of the substrate 52 as a part of the laminated film 52. Each light-emitting element 53 according to the present embodiment has a VCSEL structure and emits light in the +Z direction. As shown in FIG. 3, light emitted from each light-emitting element 53 is transmitted inside the substrate 51 from the front surface S1 to the rear surface S2 and enters the correcting lens 46 (FIGS. 2A and 2B) described above from the substrate 51. As described above, the LD chip 41 according to the present embodiment is a backside illumination-type VCSEL chip.

The anode electrode 54 is formed on a lower surface of the light-emitting element 53. The cathode electrode 55 is formed on a lower surface of a mesa portion M other than the light-emitting element 53 and extends to a lower surface of the laminated film 52 between the mesa portions M. Each light-emitting element 53 emits light when a current flows between the anode electrode 54 and a corresponding cathode electrode 55.

As described above, the LD chip 41 is arranged on the LDD substrate 42 via the bump 48 and the LD chip 41 is electrically connected to the LDD substrate 42 by the bump 48. Specifically, the connection pad 62 is formed on the substrate 61 included in the LDD substrate 42 and the mesa portion M is arranged on the connection pad 62 via the bump 48. Each mesa portion M is arranged on the bump 62 via the anode electrode 54 or the cathode electrode 55. The substrate 61 is a semiconductor substrate such as a Si (silicon) substrate.

Figure 4:
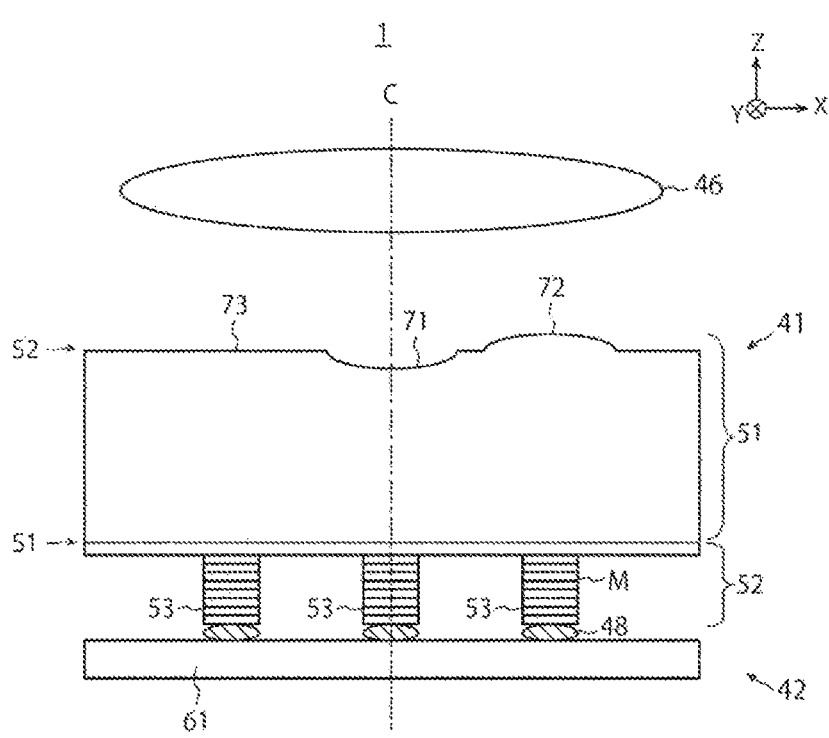
FIG. 4 is a sectional view showing a structure of a light-emitting apparatus according to the first embodiment.

The LDD substrate 42 includes the drive circuit 12 which drives the light-emitting unit 11 (FIG. 1). FIG. 4 schematically shows a plurality of switches SW included in the drive circuit 12. Each switch SW is electrically connected to a corresponding light-emitting element 53 via the bump 62. The drive circuit 12 according to the present embodiment is capable of controlling (on/off) the switches SW on an individual basis. Therefore, the drive circuit 12 can drive the plurality of light-emitting elements 53 on the basis of each light-emitting element 53. Accordingly, light emitted from the light-emitting unit 11 can be controlled precisely such as causing only the light-emitting elements 53 necessary for ranging to emit light. Arranging the LDD substrate 42 below the LD chip 41 provides an easier way to connect electrically between the respective light-emitting elements 53 and the corresponding switches SW. Thus, such individual control of the light-emitting elements 53 is realized. The LDD substrate 42 is an example of the drive apparatus according to the present disclosure.

FIG. 4 is a sectional view showing a structure of the light-emitting apparatus 1 according to the first embodiment.

FIG. 4 shows cross sections of the LD chip 41 and the LDD substrate 42 inside the light-emitting apparatus 1. As described above, the LD chip 41 includes the substrate 51, the laminated film 52, a plurality of the light-emitting elements 53, a plurality of the anode electrodes 54, and a plurality of the cathode electrodes 55, and the LDD substrate 42 includes the substrate 61 and the plurality of connection pads 62. It should be noted that illustration of the anode electrodes 54, the cathode electrodes 55, and the connection pads 62 has been omitted in FIG. 4.

The LD chip 41 according to the present embodiment includes the plurality of light-emitting elements 53 on the side of the front surface S1 of the substrate 51 and, at the same time, includes the concave lens 71, the convex lens 72, and the flat lens 73 on the side of the rear surface S2 of the substrate 51. The concave lens 71, the convex lens 72, and the flat lens 73 are arranged in a two-dimensional array pattern in a similar manner to the light-emitting elements 53. The concave lens 71, the convex lens 72, and the flat lens 73 according to the present embodiment correspond one-to-one to the light-emitting elements 53, and each of the concave lens 71, the convex lens 72, and the flat lens 73 is arranged in the +Z direction of one light-emitting element 53. FIG. 4 further shows the correcting lens 46 described earlier which is arranged above the substrate 51. The concave lens 71, the convex lens 72, and the flat lens 73 are an example of the plurality of first lenses according to the present disclosure and the correcting lens 46 is an example of the second lens according to the present disclosure.

The concave lens 71 is a lens having a concave surface and provides a concave lens surface above a corresponding light-emitting element 53. The convex lens 72 is a lens having a convex surface and provides a convex lens surface above a corresponding light-emitting element 53. The flat lens 73 is a lens having a flat surface and provides a flat lens surface above a corresponding light-emitting element 53. A state where the flat lens 73 is present above the light-emitting element 53 can also be described as a state where a lens is absent from above the light-emitting element 53. Hereinafter, the concave lens 71, the convex lens 72, and the flat lens 73 may also be simply referred to as "lenses 71, 72, and 73".

The lenses 71, 72, and 73 according to the present embodiment are provided on the rear surface S2 of a substrate 1 as a part of the substrate 51. Specifically, the lenses 71, 72, and 73 according to the present embodiment are formed by machining the substrate 51 from the rear surface S2. According to the present embodiment, the lenses 71, 72, and 73 can be readily formed by machining of the substrate 51. It should be noted that, in a similar manner to the correcting lens 46, the lenses 71, 72, and 73 may not constitute a part of the substrate 51 or the lenses 71, 72, and 73 may be arranged above the substrate 51 at a distance from the rear surface S2 of the substrate 51.

Light emitted from the plurality of light-emitting elements 53 is transmitted inside the substrate 51 from the front surface S1 to the rear surface S2 and enters the lenses 71, 72, and 73. In the present embodiment, light emitted from each light-emitting element 53 is incident on a single corresponding concave lens 71, convex lens 72, or flat lens 73. Light having passed through the lenses 71, 72, and 73 is incident on the correcting lens 46 as shown in FIG. 4. The light having passed through the correcting lens 46 is emitted toward the subject (FIG. 1).

FIG. 4 further shows an optical center (a central axis) C of the correcting lens 46. In FIG. 4, the front surface S1 of the substrate 51 is perpendicular to the Z direction and the optical center C of the correcting lens 46 is parallel to the Z direction. While the concave lens 71 is arranged at the optical center C but the convex lens 72 and the flat lens 73 are arranged at positions other than the optical center C in FIG. 4, the lenses 71, 72, and 73 may also be arranged in another aspect.

As described above, the light-emitting apparatus 1 according to the present embodiment includes the concave lens 71, the convex lens 72, and the flat lens 73 as the plurality of first lenses and includes the correcting lens 46 as the second lens. The first lenses according to the present embodiment include at least two types of lenses among the concave lens 71, the convex lens 72, and the flat lens 73 and, in FIG. 4, the first lenses include all three types of lenses. An example in which the first lenses only include two types of lenses among the concave lens 71, the convex lens 72, and the flat lens 73 will be described later.

Figures 5A, 5B:
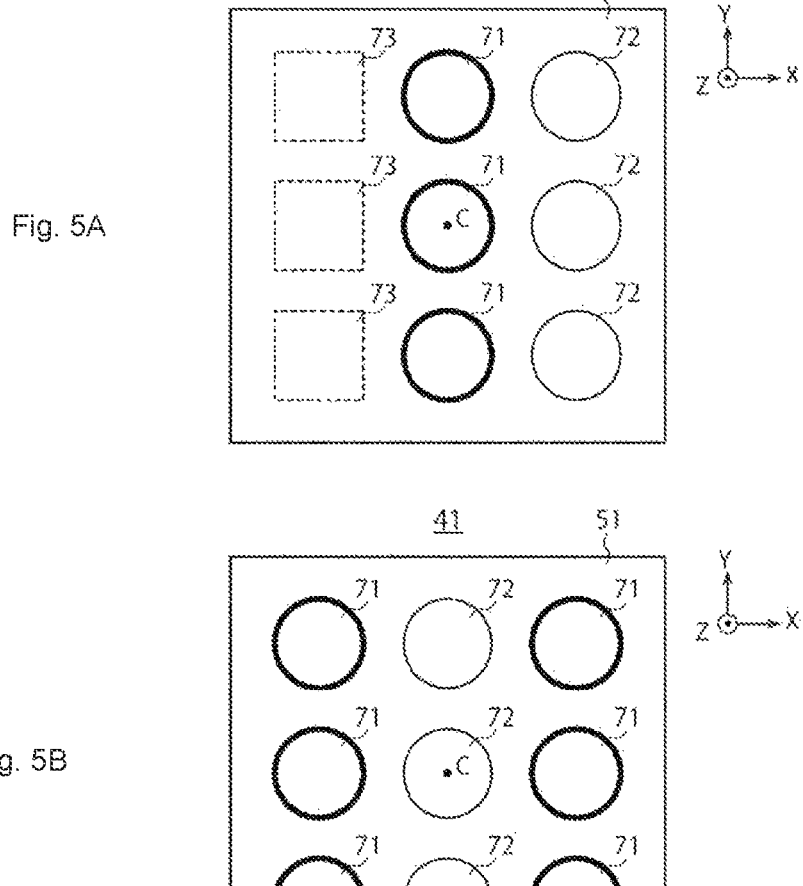
FIGS. 5A and 5B are plan views showing an example of the structure of the light-emitting apparatus according to the first embodiment.

FIGS. 5A and 5B are plan views showing an example of the structure of the light-emitting apparatus 1 according to the first embodiment.

FIG. 5A shows a first example of the structure of the light-emitting apparatus 1 according to the first embodiment. In FIG. 5A, 3×3-number of lenses 71, 72, and 73 are arranged in a two-dimensional array pattern or, more specifically, in a square lattice shape on the rear surface S2 of the substrate 51. In FIG. 5A, a plurality of concave lenses 71 are arranged in a single row, a plurality of convex lenses 72 are similarly arranged in a single row, and a plurality of flat lenses 73 are similarly arranged in a single row. In this manner, the first lenses in FIG. 5A include all three types of lenses among the concave lens 71, the convex lens 72, and the flat lens 73. It should be noted that the number of first lenses inside the light-emitting apparatus 1 in FIG. 5A may be other than 3×3 and an arrangement of the three types of lenses may be other than the arrangement shown in FIG. 5A.

FIG. 5B shows a second example of the structure of the light-emitting apparatus 1 according to the first embodiment. In FIG. 5B, 3×3-number of lenses 71 and 72 are arranged in a two-dimensional array pattern or, more specifically, in a square lattice shape on the rear surface S2 of the substrate 51. In FIG. 5B, a plurality of concave lenses 71 are arranged in two rows and a plurality of convex lenses 72 are arranged in a single row. As described above, the first lenses in FIG. 5B only include two types of lenses among the concave lens 71, the convex lens 72, and the flat lens 73. It should be noted that the number of first lenses inside the light-emitting apparatus 1 in FIG. 5B may be other than 3×3 and an arrangement of the two types of lenses may be other than the arrangement shown in FIG. 5B.

Figure 6A:
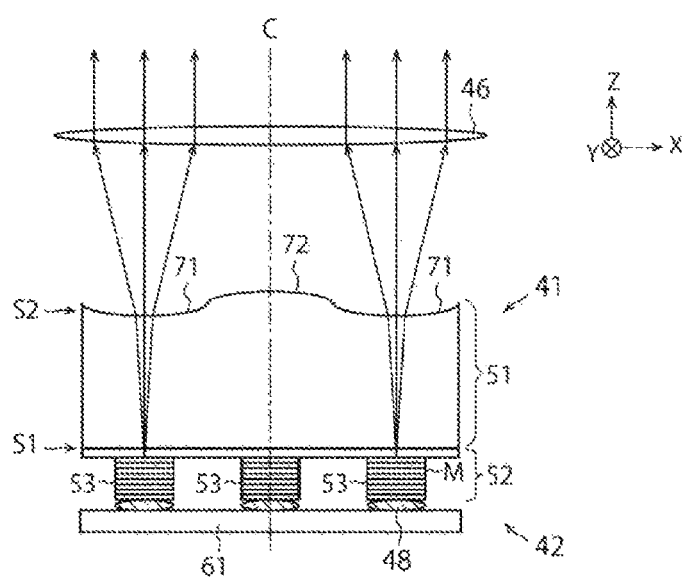
FIGS. 6A and 6B is a are sectional views showing an example of usage of the light-emitting apparatus according to the first embodiment.
Figure 6B:
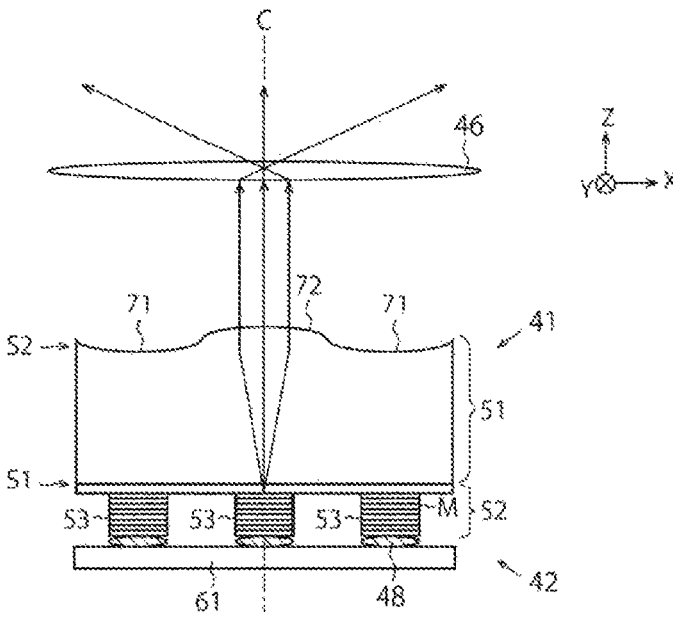

FIGS. 6A and 6B are sectional views showing an example of usage of the light-emitting apparatus 1 according to the first embodiment.

FIG. 6A shows two concave lenses 71 among the plurality of concave lenses 71 included in the light-emitting apparatus 1 and one convex lens 72 among the plurality of convex lenses 72 included in the light-emitting apparatus 1. In FIG. 6A, only the concave lenses 71 among the lenses 71 and 72 are used. Specifically, by switching on a switch SW of the light-emitting element 53 corresponding to the concave lens 71 and switching off a switch SW of the light-emitting element 53 corresponding to the convex lens 72, the LDD substrate 42 drives only the light-emitting element 53 corresponding to the concave lens 71. As a result, light is only emitted from the light-emitting element 53 corresponding to the concave lens 71, the emitted light is incident on the concave lens 71, and light having passed through the concave lens 71 is incident on the correcting lens 46.

FIG. 6A indicates, by an arrow, light emitted from the light-emitting element 53 and having passed through the concave lens 71 and the correcting lens 46. Since the light is not overly diffused by the correcting lens 46, for example, the light is suitably used for a dot projector in facial recognition.

FIG. 6B also shows two concave lenses 71 among the plurality of concave lenses 71 included in the light-emitting apparatus 1 and one convex lens 72 among the plurality of convex lenses 72 included in the light-emitting apparatus 1. In FIG. 6B, only the convex lens 72 among the lenses 71 and 72 are used. Specifically, by switching on a switch SW of the light-emitting element 53 corresponding to the convex lens 72 and switching off a switch SW of the light-emitting element 53 corresponding to the concave lens 71, the LDD substrate 42 drives only the light-emitting element 53 corresponding to the convex lens 72. As a result, light is only emitted from the light-emitting element 53 corresponding to the convex lens 72, the emitted light is incident on the convex lens 72, and light having passed through the convex lens 72 is incident on the correcting lens 46.

FIG. 6B indicates, by an arrow, light emitted from the light-emitting element 53 and having passed through the convex lens 72 and the correcting lens 46. Since the light is overly diffused by the correcting lens 46, for example, the light is suitably used for a flood illuminator in facial recognition.

In the present embodiment, for example, only the flat lens 73 may be used in the light-emitting apparatus 1 including the lenses 71, 72, and 73. In this case, light emitted from the correcting lens 46 is, for example, parallel light of which a state of being parallel light is only maintained over a short distance. Such parallel light is suitably used for, for example, a camera of a smartphone in which a focal point remains unchanged.

As described above, the light-emitting apparatus 1 according to the present embodiment includes at least two types of lenses among the concave lens 71, the convex lens 72, and the flat lens 73. Therefore, according to the present embodiment, changing the type of lens to be used enables light from the light-emitting element 53 to be shaped into light with shapes which differ according to use applications. For example, light from the light-emitting element 53 can be shaped into light for a dot projector by using only the concave lens 71 or shaped into light for a flood illuminator by using only the convex lens 72.

In addition, the light-emitting apparatus 1 according to the present embodiment includes the LDD substrate 42 which is capable of driving the plurality of light-emitting elements 53 on the basis of each light-emitting element 53. Accordingly, light with various shapes can be emitted with a single light-emitting apparatus 1. For example, by providing a single light-emitting apparatus 1 with the concave lens 71 and the convex lens 72 and controlling driving of the light-emitting elements 53 with the LDD substrate 42, both light for a dot projector and light for a flood illuminator can be emitted from the light-emitting apparatus 1. Accordingly, the light-emitting apparatus 1 capable of emitting such light can be subjected to downsizing and weight reduction and the hassle and cost of preparing the light-emitting apparatus 1 capable of emitting such light can be reduced.

In the present embodiment, in addition to simultaneously using only one type of lens among two or more types of lenses, two types of lenses may be simultaneously used or three types of lenses may be simultaneously used. For example, in the light-emitting apparatus 1 including the lenses 71, 72, and 73, only the concave lens 71 and the flat lens 73 may be simultaneously used. In addition, in the light-emitting apparatus 1 including the lenses 71, 72, and

73, only a part of the concave lenses 71, a part of the convex lenses 72, and a part of the flat lenses 73 may be simultaneously used.

Hereinafter, a light-emitting apparatus 1 according to modifications of the present embodiment will be described with reference to FIGS. 7A, 7B, 8A, 8B, 9A, 9B, 10A, 10B, 10C, 10D, 10E, 10F, 10G, 10H, 10I, 10J, 10K, 10L, 11A, 11B, 12A, 12B, and 12C.

Figures 7A, 7B:
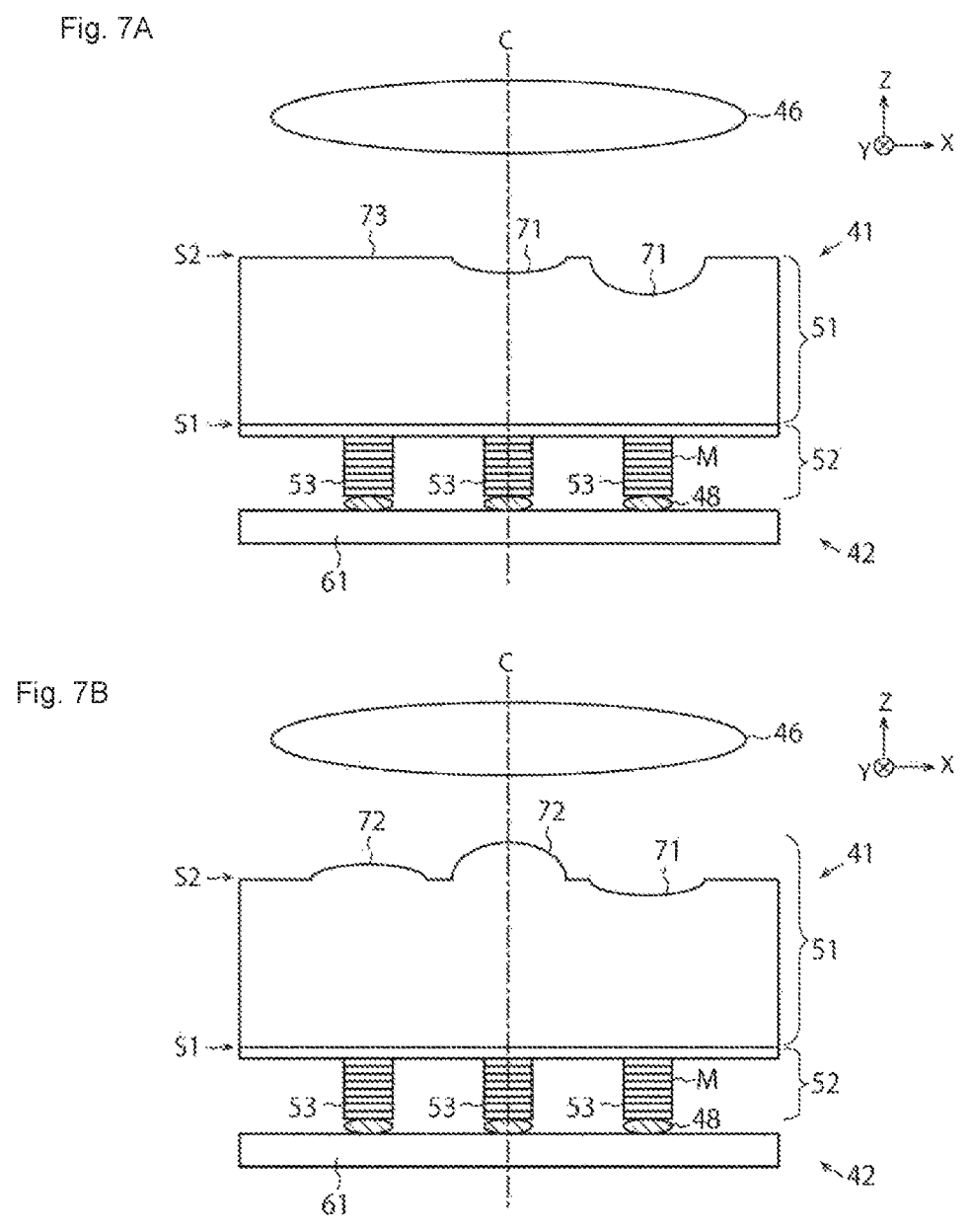

FIGS. 7A and 7B are sectional views showing a structure of the light-emitting apparatus 1 according to a modification of the first embodiment.

The light-emitting apparatus 1 shown in FIG. 7A includes only the concave lens 71 and the flat lens 73 among the lenses 71, 72, and 73. Such a configuration is adopted when, for example, the convex lens 72 is not required.

In this case, the light-emitting apparatus 1 shown in FIG. 7A includes two types of concave lenses 71 with different shapes. Specifically, the concave lenses 71 according to the present modification include a concave lens 71 with a small-depth concave portion and a concave lens 71 with a large-depth concave portion. Therefore, according to the present modification, changing the type of concave lens 71 to be used enables light from the light-emitting element 53 to be shaped into light with shapes which differ according to use applications. The concave lenses 71 are an example of the first concave lens and the second concave lens according to the present disclosure.

The light-emitting apparatus 1 shown in FIG. 7B includes only the concave lens 71 and the convex lens 72 among the lenses 71, 72, and 73. Such a configuration is adopted when, for example, the flat lens 73 is not required.

In this case, the light-emitting apparatus 1 shown in FIG. 7B includes two types of convex lenses 72 with different shapes. Specifically, the convex lenses 71 according to the present modification include a convex lens 72 with a small-height convex portion and a convex lens 72 with a large-height convex portion. Therefore, according to the present modification, changing the type of convex lens 72 to be used enables light from the light-emitting element 53 to be shaped into light with shapes which differ according to use applications. The convex lenses 72 are an example of the first convex lens and the second convex lens according to the present disclosure.

Figure 8A:
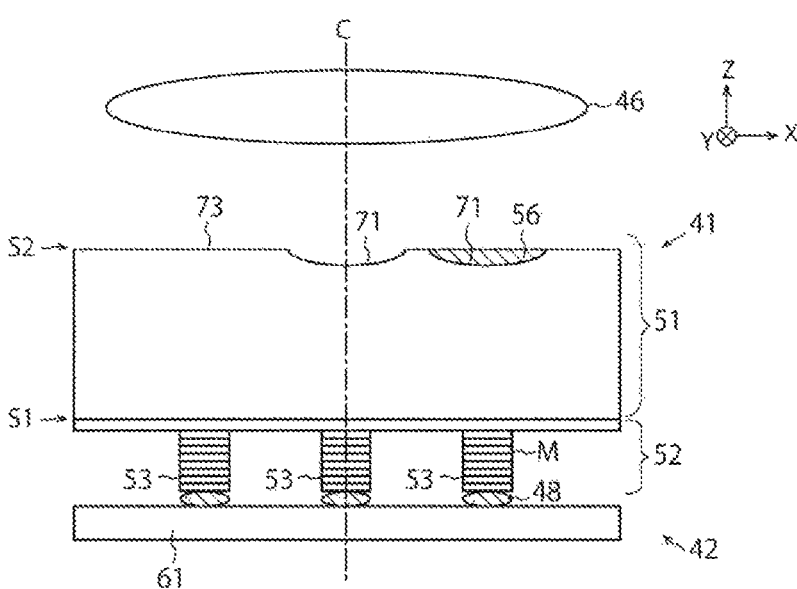
FIGS. 8A and 8B is a are sectional views showing a structure of a light-emitting apparatus according to another modification of the first embodiment.
Figure 8B:
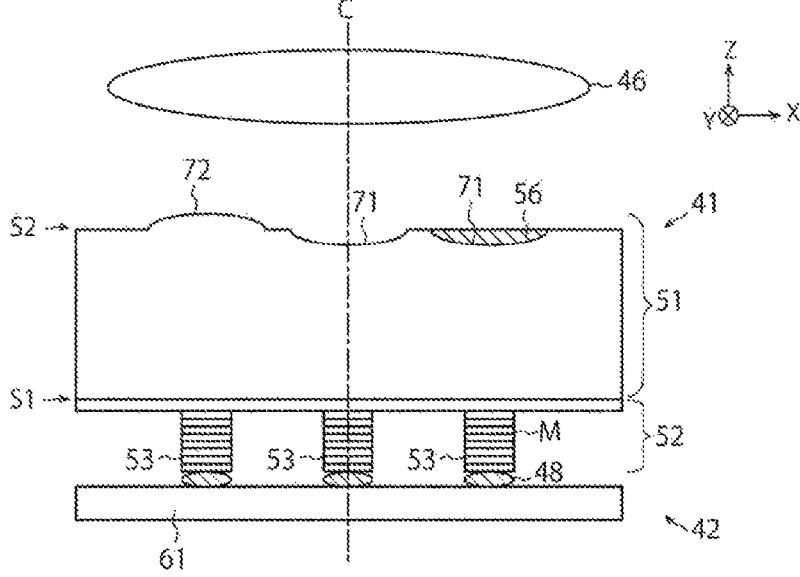

FIGS. 8A and 8B are sectional views showing a structure of the light-emitting apparatus 1 according to another modification of the first embodiment.

The light-emitting apparatus 1 shown in FIG. 8A includes only the concave lens 71 and the flat lens 73 among the lenses 71, 72, and 73. Such a configuration is adopted when, for example, the convex lens 72 is not required.

In this case, the light-emitting apparatus 1 shown in FIG. 8A includes an embedded film 56 which is provided on a surface of the concave lens 71 and which is embedded in the concave portion of the concave lens 71. The embedded film 56 according to the present modification has a flat surface (upper surface) on a side opposite to the concave lens 71. The embedded film 56 may be formed of any material as long as the material is capable of transmitting light. According to the present modification, selectively using the concave lens 71 provided with the embedded film 56 and the concave lens 71 not provided with the embedded film 56 enables light from the light-emitting element 53 to be shaped into light with shapes which differ according to use applications. Since the embedded film 56 has a flat upper surface, the embedded film 56 functions in a similar manner to the flat lens 73.

The light-emitting apparatus 1 shown in FIG. 8B includes only the concave lens 71 and the convex lens 72 among the lenses 71, 72, and 73. Such a configuration is adopted when, for example, the flat lens 73 is not required.

In this case, in a similar manner to the light-emitting apparatus 1 shown in FIG. 8A, the light-emitting apparatus 1 shown in FIG. 8B includes the embedded film 56 which is provided on a surface of the concave lens 71 and which is embedded in the concave portion of the concave lens 71. According to the present modification, selectively using the concave lens 71 provided with the embedded film 56 and the concave lens 71 not provided with the embedded film 56 enables light from the light-emitting element 53 to be shaped into light with shapes which differ according to use applications.

Figure 9A:
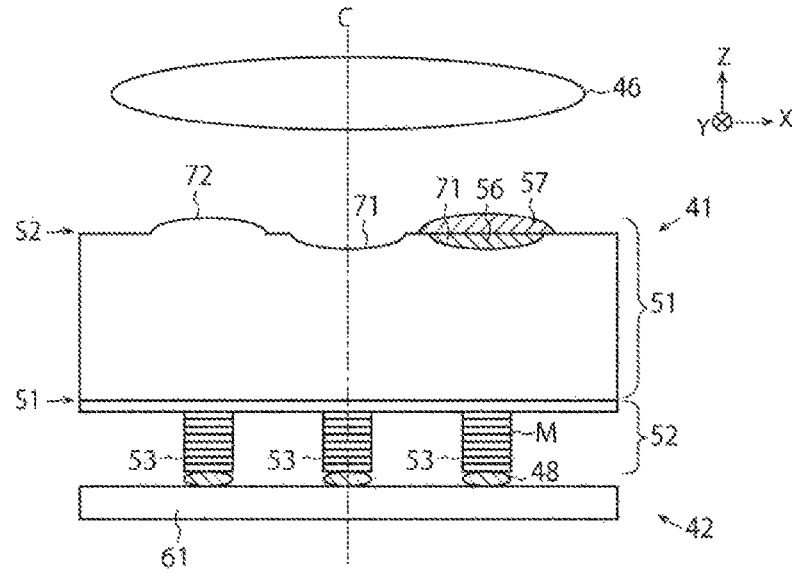
FIGS. 9A and 9B are sectional views showing a structure of a light-emitting apparatus according to another modification of the first embodiment.
Figure 9B:
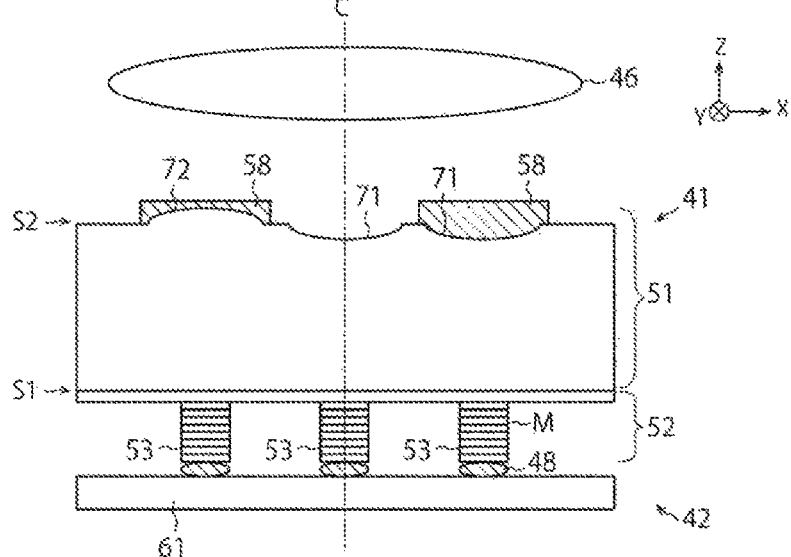

FIGS. 9A and 9B are sectional views showing a structure of the light-emitting apparatus 1 according to another modification of the first embodiment.

The light-emitting apparatus 1 shown in FIG. 9A includes only the concave lens 71 and the convex lens 72 among the lenses 71, 72, and 73. Such a configuration is adopted when, for example, the flat lens 73 is not required.

In this case, in a similar manner to the light-emitting apparatus 1 shown in FIG. 8A, the light-emitting apparatus 1 shown in FIG. 9A includes the embedded film 56 which is provided on a surface of the concave lens 71 and which is embedded in the concave portion of the concave lens 71. The light-emitting apparatus 1 shown in FIG. 9A further includes a protruding film 57 which is provided on a surface of the embedded film 56 and which protrudes from the rear surface S2 of the substrate 51. The protruding film 57 according to the present modification has a convex surface (upper surface) on a side opposite to the embedded film 56. The protruding film 57 may be formed of any material as long as the material is capable of transmitting light. The protruding film 57 may be formed of a same material as the embedded film 56 or formed of a different material from the embedded film 56. According to the present modification, selectively using the concave lens 71 provided with the embedded film 56 and the protruding film 57 and the concave lens 71 not provided with the embedded film 56 and the protruding film 57 enables light from the light-emitting element 53 to be shaped into light with shapes which differ according to use applications. Since the protruding film 57 has a convex upper surface, the protruding film 57 functions in a similar manner to the convex lens 72.

The light-emitting apparatus 1 shown in FIG. 9B includes only the concave lens 71 and the convex lens 72 among the lenses 71, 72, and 73. Such a configuration is adopted when, for example, the flat lens 73 is not required.

In this case, the light-emitting apparatus 1 shown in FIG. 9B includes a coating film 58 which is provided on surfaces of the concave lens 71 and the convex lens 72 and which has a flat surface (upper surface) on a side opposite to the concave lens 71 and the convex lens 72. The surfaces of the concave lens 71 and the convex lens 72 are coated by the coating film 58. The coating film 58 may be formed of any material as long as the material is capable of transmitting light. According to the present modification, selectively using the concave lens 71 provided with the coating film 58 and the concave lens 71 not provided with the coating film 58 enables light from the light-emitting element 53 to be shaped into light with shapes which differ according to use applications. Since the coating film 58 has a flat upper surface, the coating film 58 functions in a similar manner to the flat lens 73.

It should be noted that the embedded film 56, the protruding film 57, and the coating film 58 may be caused to function as an antireflective film. Another example of an antireflective film will be described later.

FIGS. 10A, 10B, 10C, 10D, 10E, 10F, 10G, 10H, 10I, 10J, 10K, and 10L are plan views showing a structure of the light-emitting apparatus 1 according to another modification of the first embodiment.

In FIGS. 10A, 10B, 10C, 10D, 10E, 10F, 10G, 10H, 10I, 10J, 10K, and 10L, a reference sign a denotes a region in which the concave lens 71 is arranged on the rear surface S2 of the substrate 51, a reference sign β denotes a region in which the convex lens 72 is arranged on the rear surface S2 of the substrate 51, and a reference sign y denotes a region in which the flat lens 73 is arranged on the rear surface S2 of the substrate 51. Hereinafter, the regions will be referred to as a "concave region α", a "convex region β", and a "flat region γ".

Figures 10A, 10B, 10C, 10D, 10E, 10F, 10G, 10H, 10I, 10J, 10K, 10L:
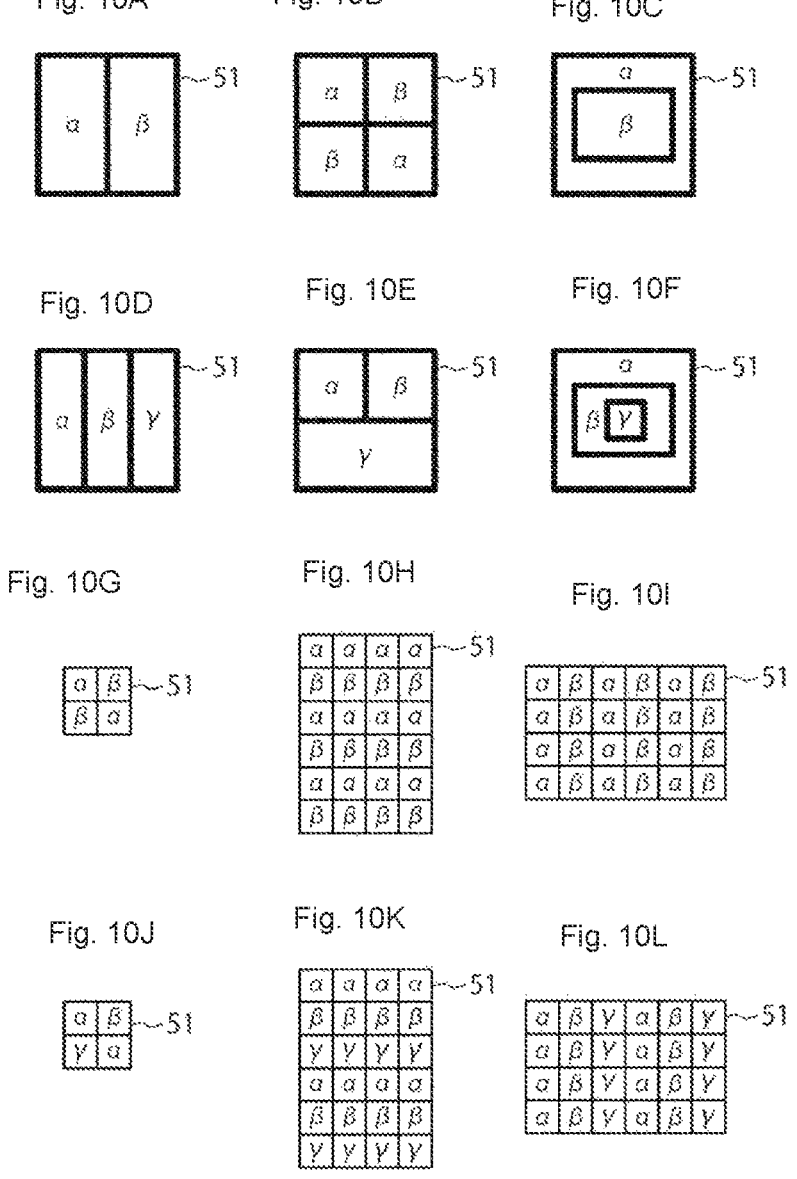
FIGS. 10A, 10B, 10C, 10D, 10E, 10F, 10G, 10H, 10I, 10J, 10K, and 10L is a are plan views showing a structure of a light-emitting apparatus according to another modification of the first embodiment.

In FIG. 10A, the rear surface S2 of the substrate 51 is divided into two regions of which one region is the concave region α and the other region is the convex region β. For example, when N×M-number of lenses 71 and 72 are arranged on the rear surface S2 of the substrate 51, the concave region α includes (N/2)×M-number of concave lenses 71 and the convex region β includes (N/2)×M-number of convex lenses 72 (where N and M are integers equal to or greater than 2). In a similar manner, the rear surface S2 of the substrate 51 is divided into four regions in FIG. 10B while the rear surface S2 of the substrate 51 is divided into two regions in FIG. 10C.

In FIG. 10D, the rear surface S2 of the substrate 51 is divided into three regions which are constituted of the concave region α, the convex region β, and the flat region γ. For example, when N×M-number of lenses 71, 72, and 73 are arranged on the rear surface S2 of the substrate 51, the concave region α includes (N/3)×M-number of concave lenses 71, the convex region β includes (N/3)×M-number of convex lenses 72, and the flat region γ includes (N/3)×M-number of flat lenses 73. In a similar manner, the rear surface S2 of the substrate 51 is divided into three regions in FIG. 10E and the rear surface S2 of the substrate 51 is divided into three regions in in FIG. 10E.

In A to F in FIGS. 10A, 10B, 10C, 10D, 10E, and 10F, the rear surface S2 of the substrate 51 is divided into a few regions. On the other hand, in FIGS. 10G, 10H, 10I, 10J, 10K, and 10L, the rear surface S2 of the substrate 51 is divided into a large number of regions.

FIG. 10G shows a region for four lenses 71 and 72 on the rear surface S2 of the substrate 51. In the modification shown in FIG. 10G, the region is divided into two concave regions a and two convex regions β. In FIG. 10G, each concave region α includes one concave lens 71 and each convex region β includes one convex lens 72. The light-emitting apparatus 1 according to the present modification includes a plurality of unit regions on the rear surface S2 of the substrate 51 and each unit region has a structure shown in FIG. 10G. In other words, in the light-emitting apparatus 1 according to the present modification, the structure shown in FIG. 10G is repeated in an X direction and a Y direction.

This description similarly applies to FIGS. 10H, 10I, 10J, 10K, and 10L. For example, in the modification shown in FIG. 10H, the structure shown in FIG. 10H is repeated in an X direction and a Y direction.

The structures shown in FIGS. 10A, 10B, 10C, 10D, 10E, and 10F have an advantage that, for example, wiring inside the LDD substrate 42 can be readily laid out. On the other hand, the structures shown in FIGS. 10G, 10H, 10I, 10J.

10K, and 10L have an advantage that, for example, a deviation of a position of light can be suppressed.

Figures 11A, 11B:
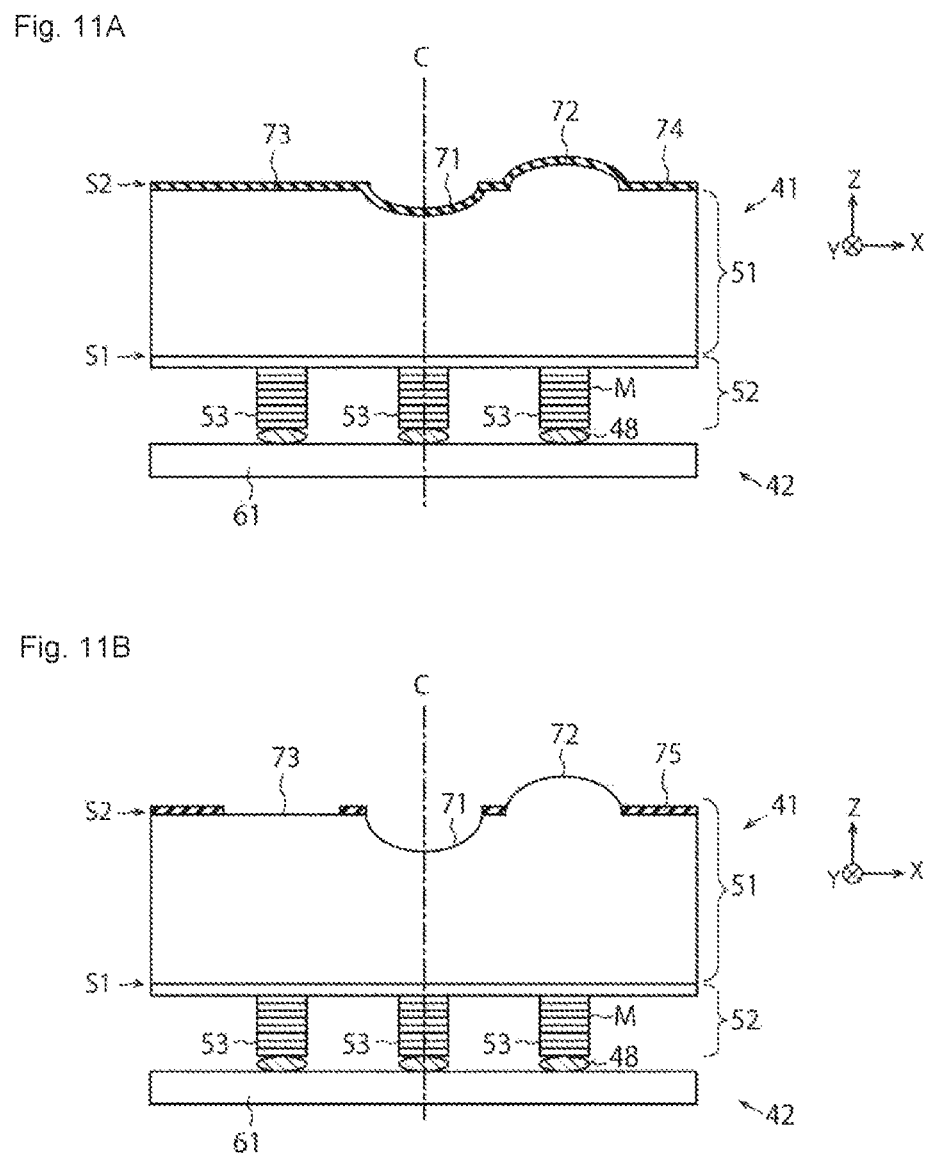

FIGS. 11A and 11B are sectional views showing a structure of the light-emitting apparatus 1 according to another modification of the first embodiment.

The LD chip 41 shown in FIG. 11A includes an antireflective film 74 formed on the rear surface S2 of the substrate 51. The antireflective film 74 covers a surface of each of the lenses 71, 72, and 73. The antireflective film 74 according to the present modification includes one or more layers of an inorganic oxide film or an inorganic nitride film and, for example, includes one or more of a SiO2 film (silicon oxide film), a SiON film (silicon oxynitride film), a SiN film (silicon nitride film), a SiOC film (silicon oxycarbide film), a SiC film (silicon carbide film), a TiO2 film (titanium oxide film), a TiN film (titanium nitride film), a TiON film (titanium oxynitride film), an Al2O3 film (aluminum oxide film), a Nb2O5 film (niobium oxide film), a ZrO2 film (zirconium oxide film), and a Ta2O5 film (tantalum oxide film).

According to the present modification, by forming the antireflective film 74 on the rear surface S2 of the substrate 51, light can be prevented from being reflected by the lenses 71, 72, and 73 and the like. When the substrate 51 is a GaAs substrate, since reflectance of the GaAs substrate is high, the antireflective film 74 is desirably formed on the rear surface S2 of the substrate 51.

The LD chip 41 shown in FIG. 11B includes an inorganic film 75 formed on the rear surface S2 of the substrate 51 between the lenses 71, 72, and 73. Therefore, each of the lenses 71, 72, and 73 is exposed from the inorganic film 75. For example, the inorganic film 75 according to the present modification includes one or more of a SiO2 film, a SiON film, a SiN film, a SiOC film, a SiC film, a W (tungsten) film, a Ti film, an Au (gold) film, and an Al film.

According to the present modification, by forming the inorganic film 75 on the rear surface S2 of the substrate 51 between the lenses 71, 72, and 73, for example, light can be prevented from passing through portions other than the lenses 71, 72, and 73. The inorganic film 75 in this case may be a light-shielding film or another film which enables light from the substrate 51 to readily return to the substrate 51.

Figure 12A:
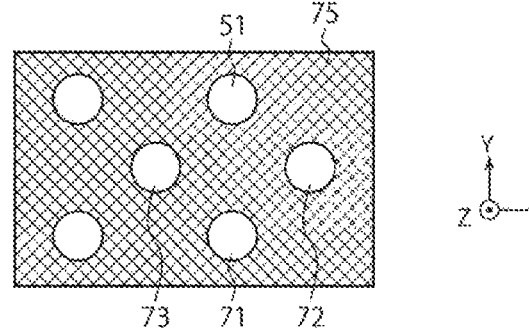
FIGS. 12A, 12B, and 12C are plan views showing an example of the structure of the light-emitting apparatus shown in Bin-FIG. 11B.
Figure 12B:
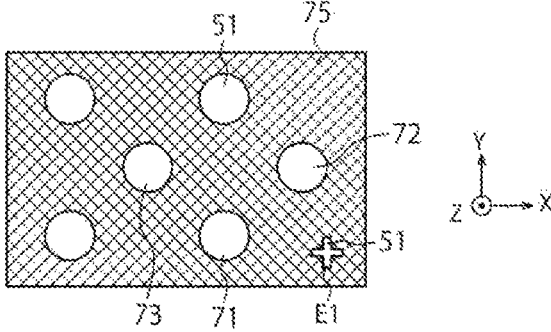
Figure 12C:
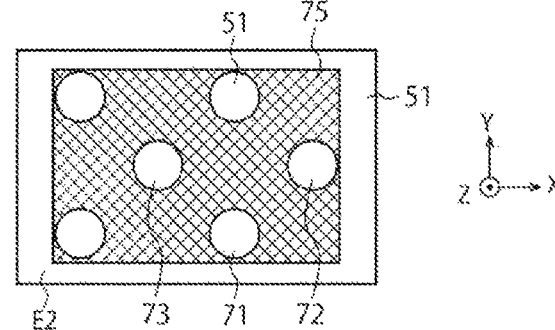

FIGS. 12A, 12B, and 12C are plan views showing an example of the structure of the light-emitting apparatus 1 shown in FIG. 11B.

In FIG. 12A, the inorganic film 75 is formed on the entire rear surface S2 of the substrate 51 with the exception of regions of the lenses 71, 72, and 73. Accordingly, for example, light can be effectively prevented from passing through portions other than the lenses 71, 72, and 73.

In FIG. 12B, an opening E1 which exposes the rear surface S2 of the substrate 51 is formed inside the inorganic film 75. For example, the opening E1 can be used as an alignment mark for aligning positions of the lenses 71, 72, and 73 with positions of other optical elements.

In FIG. 12C, the inorganic film 75 is not formed on the rear surface S2 of the substrate 51 in a region E2 near an end of the substrate 51. When using the inorganic film 75 to prevent light from passing through portions other than the lenses 71, 72, and 73, the inorganic film 75 need not necessarily be formed in regions that are far away from the light-emitting elements 53 or the lenses 71, 72, and 73. Therefore, in FIG. 12C, the inorganic film 75 is not formed in the region E2 near the end of the substrate 51.

It should be noted that the inorganic film 75 may include a different film depending on a location on the rear surface S2 of the substrate 51. For example, the inorganic film 75 may include one type of film in a region near the end of the substrate 51 and may include two types of films in other regions. Accordingly, a function similar to that of the inorganic film 75 in FIG. 12C can be realized.

Figures 13A, 13B:
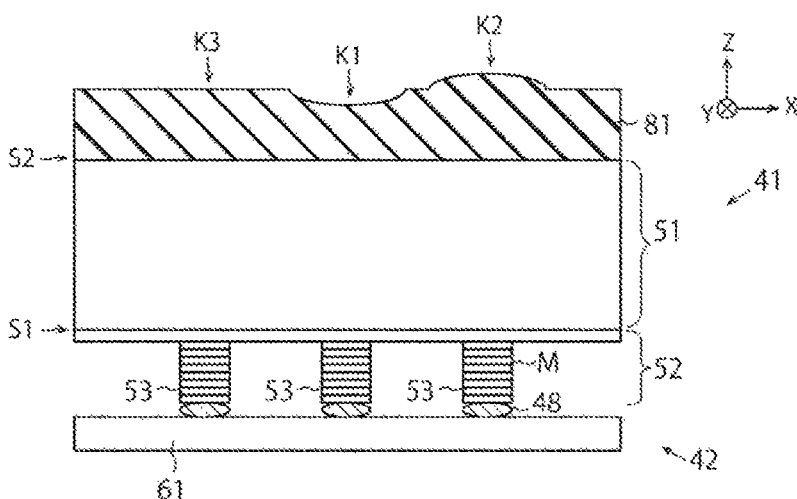
FIGS. 13A and 13B are sectional views showing a manufacturing method of the light-emitting apparatus according to the first embodiment.

FIGS. 13A and 13B are sectional views showing a manufacturing method of the light-emitting apparatus 1 according to the first embodiment.

First, after forming the laminated film 52, the light-emitting elements 53, and the like on the front surface S1 of the substrate 51, a mask layer 81 is formed on the rear surface S2 of the substrate 51 (FIG. 13A). For example, the mask layer 81 may be a resist film or a hard mask layer such as a SiO2 film.

Next, a concave portion K1 having a concave shape, a convex portion K2 having a convex shape, and a flat portion K3 having a flat shape are formed on a surface of the mask layer 81 (FIG. 13A). The concave portion K1, the convex portion K2, and the flat portion K3 are simultaneously formed by, for example, grayscale lithography or implantation.

Next, the concave portion K1, the convex portion K2, and the flat portion K3 of the mask layer 81 are transferred to the substrate 51 by etching (FIG. 13B). As a result, the rear surface S2 of the substrate 51 is machined by etching and the concave lens 71, the convex lens 72, and the flat lens 73 having shapes similar to the concave portion K1, the convex portion K2, and the flat portion K3 prior to the etching are formed on the rear surface S2 of the substrate 51. The etching is, for example, dry etching.

In the present embodiment, subsequently, the correcting lens 46 described earlier is arranged above the lenses 71, 72, and 73 (refer to FIG. 4). The light-emitting apparatus 1 shown in FIG. 4 is manufactured in this manner.

It should be noted that the method according to the present embodiment can also be adopted when manufacturing the light-emitting apparatus 1 shown in FIG. 7A and when manufacturing the light-emitting apparatus 1 shown in FIG. 7B. When manufacturing the light-emitting apparatus 1 shown in FIG. 7A, a shallow concave portion K1 and a deep concave portion K1 are formed in the step of FIG. 13A. Accordingly, a shallow concave lens 71 is formed from the shallow concave portion K1 and a deep concave lens 71 is formed from the deep concave portion K1. When manufacturing the light-emitting apparatus 1 shown in FIG. 7A, a low convex portion K2 and a high convex portion K2 are formed in the step of FIG. 13A. Accordingly, a low convex lens 72 is formed from the low convex portion K2 and a high convex lens 72 is formed from the high convex portion K2.

Figures 14A, 14B, 14C:
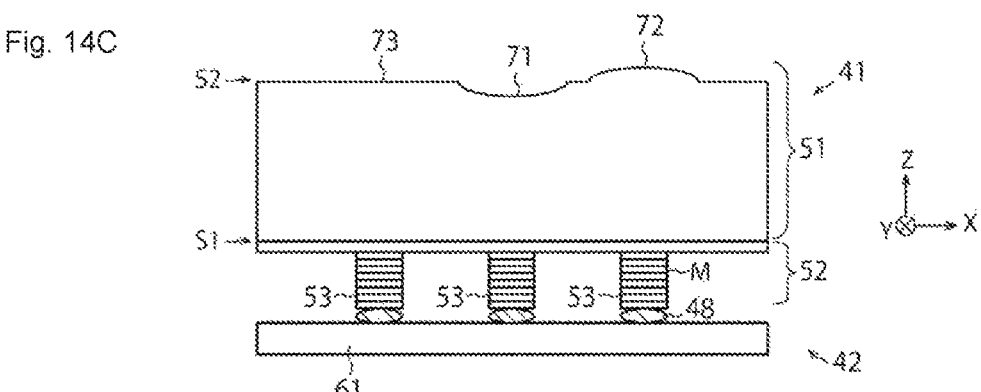
FIGS. 14A, 14B, and 14C are sectional views showing a manufacturing method of a light-emitting apparatus according to a modification of the first embodiment.

FIGS. 14A, 14B, and 14C are sectional views showing a manufacturing method of the light-emitting apparatus 1 according to a modification of the first embodiment.

First, after forming the laminated film 52, the light-emitting elements 53, and the like on the front surface S1 of the substrate 51, the concave lens 71 is formed on the rear surface S2 of the substrate 51 (FIG. 14A). Next, a mask layer 82 having a convex shape is formed on the rear surface S2 of the substrate 51 (FIG. 14B). For example, the mask layer 82 may be a resist film or a hard mask layer such as a SiO2 film.

Next, the mask layer 82 and the rear surface S2 of the substrate 51 are machined by dry etching (FIG. 14C). As a result, the mask layer 82 is transferred to the substrate 51 and the convex lens 72 having a shape similar to the mask layer 82 prior to dry etching is formed on the rear surface S2 of the substrate 51. In addition, near the concave lens 71, dry etching of the rear surface S2 of the substrate 51 proceeds uniformly and the concave lens 71 remains on the rear surface S2 of the substrate 51. Furthermore, a flat surface on the rear surface S2 of the substrate 51 becomes the flat lens 73.

In the present modification, subsequently, the correcting lens 46 described earlier is arranged above the lenses 71, 72, and 73 (refer to FIG. 4). The light-emitting apparatus 1 shown in FIG. 4 is manufactured in this manner. It should be noted that the method according to the present modification can also be adopted when manufacturing the light-emitting apparatus 1 shown in FIG. 7A and when manufacturing the light-emitting apparatus 1 shown in FIG. 7B.

As described above, the method shown in FIGS. 13A and 13B enable the concave lens 71 and the convex lens 72 to be simultaneously formed on the rear surface S2 of the substrate 51, and the method shown in FIGS. 14A, 14B, and 14C enable the concave lens 71 and the convex lens 72 to be sequentially formed on the rear surface S2 of the substrate 51. According to the former method, for example, the lenses 71 and 72 can be formed by a smaller number of steps. According to the latter method, for example, the lenses 71 and 72 can be formed by various generally-used methods as will be described later.

FIGS. 15A, 15B, 15C, 15D, 16A, 16B, 16C, and 16D are sectional views for explaining details of the step shown in FIG. 14A.

First, a resist film 83 is formed on the rear surface S2 of the substrate 51 and the resist film 83 is lithographically patterned (FIG. 15A). As a result, the resist film 83 including a resist portion P1 and an opening P2 is formed on the rear surface S2 of the substrate.

Next, reflow bake of the patterned resist film 83 is performed (FIG. 15B). As a result, the resist film 83 changes into a resist film 84 which includes a resist portion P3 having been rounded due to surface tension. The resist film 84 includes the resist portion P3 and an opening P4.

Next, the resist portion (resist pattern) P3 of the baked resist film 84 is transferred to the substrate 51 by dry etching (FIG. 15C). As a result, the rear surface S2 of the substrate 51 is machined by dry etching and a plurality of convex portions 85 having a shape similar to the resist portion P3 prior to the dry etching are formed on the rear surface S2 of the substrate 51.

Next, a hard mask layer 86 is formed on the rear surface S2 of the substrate 51 so as to cover the convex portions 85 (FIG. 15D). The hard mask layer 86 is, for example, an SOG (Spin On Glass) layer.

Subsequently, the hard mask layer 86 is gradually removed by dry etching. As a result, the convex portions 85 are exposed from the hard mask layer 86 by dry etching, and as the hard mask layer 86 is removed together with the convex portions 85 by subsequent dry etching, the convex portions 85 change into concave portions or, in other words, the concave lenses 71. The concave lenses 71 are formed on the rear surface S2 of the substrate 51 in this manner. For example, dry etching is performed using a chlorine-based gas such as BCl3 gas or Cl2 gas (where B denotes boron and Cl denotes chlorine). O2 (oxygen) gas, N2 (nitrogen) gas, or Ar (argon) gas may be used together with the chlorine-based gas. Details of this step will be explained with reference to FIGS. 16A, 16B, 16C, and 16D.

Figures 16A, 16B, 16C, 16D:
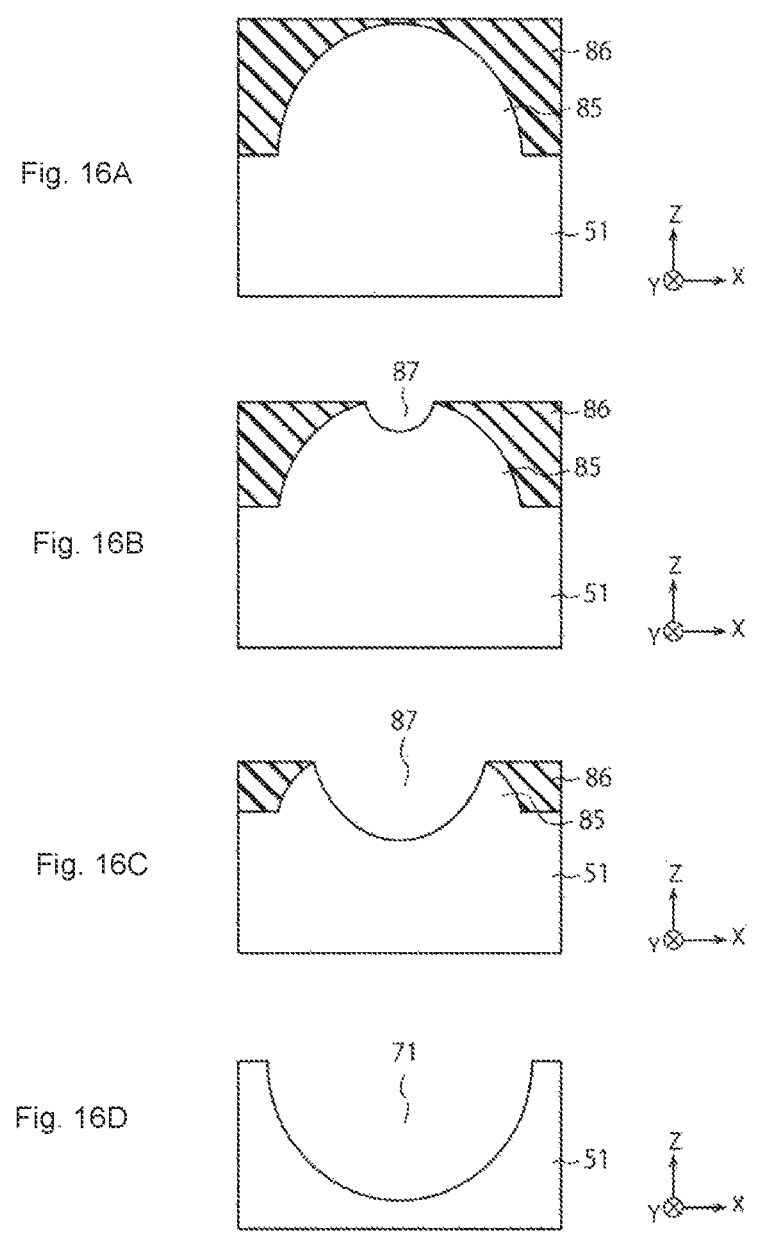

FIG. 16A shows the convex portion 85 covered by the hard mask layer 86. As the hard mask layer 86 is gradually removed by dry etching, the convex portion 85 is exposed from the hard mask layer 86 (FIG. 16A). In subsequent dry etching, due to a difference in etching rates between the substrate 51 (a GaAs substrate) and the hard mask layer 86 (a SOG film), the convex portion 85 is etched at a faster etching rate than the hard mask layer 86 (FIG. 15C). As a result, a concave portion 87 is formed at an upper end of the convex portion 85, a size of the concave portion 87 gradually increases, and as the convex portion 85 is finally removed, the concave portion 87 or, in other words, the concave lens 71 is formed at a position from which the convex portion 85 has been removed. The step shown in FIG. 14A proceeds in this manner.

It should be noted that the mask layer 82 shown in FIG. 14B may be formed by the same method as the resist film 84 shown in FIG. 15B.

In addition, the method shown from FIGS. 15A, 15B, 15C, 15D, 16A. 16B, 16C, and 16D can be replaced with other methods. Two examples of such methods will be described below.

Figures 17A, 17B:
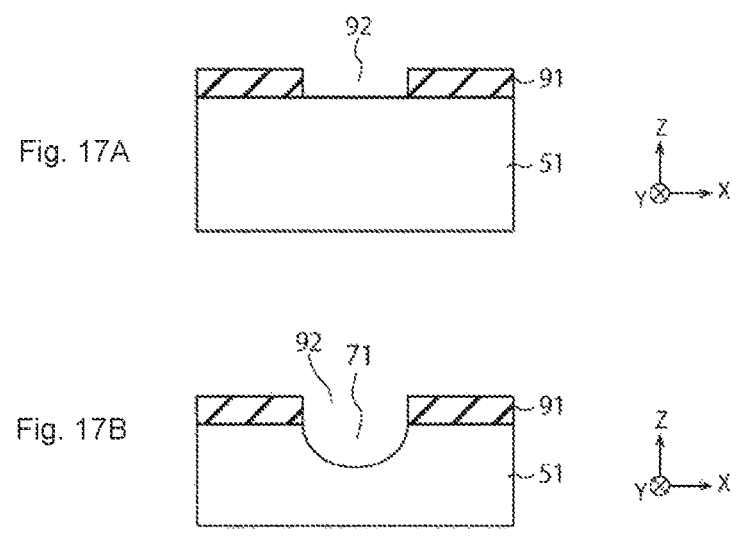

FIGS. 17A and 17B are sectional views showing a method 1 which differs from the method shown from FIGS. 15A, 15B, 15C, 15D, 16A, 16B, 16C, and 16D.

First, a hard mask layer 91 is formed on an upper surface (the rear surface S2) of the substrate 51 and an opening 92 is formed in the hard mask layer 91 (FIG. 17A). The hard mask layer 91 is, for example, an SiO2 layer.

Next, an upper surface of the hard mask layer 91 is planarized by CMP (Chemical Mechanical Polishing) (FIG. 17A). In doing so, a phenomenon known as "dishing" occurs in which the upper surface of the substrate 51 being exposed inside the opening 92 is recessed by CMP. As a result, a concave portion or, in other words, the concave lens 71 is formed on the upper surface (the rear surface S2) of the substrate 51 inside the opening 92. Subsequently, the hard mask layer 91 is removed.

FIGS. 18A, 18B, 18C, and 18D are sectional views showing a method 2 which differs from the method shown from FIGS. 15A, 15B, 15C, 15D, 16A, 16B. 16C, and 16D.

First, a first hard mask layer 93 is formed on the upper surface (the rear surface S2) of the substrate 51, a second hard mask layer 94 is formed on the first hard mask layer 93, and a small opening 95 is formed in the second hard mask layer 94 (FIG. 18A). The first hard mask layer 93 is, for example, an organic film such as a carbon film. The second hard mask layer 94 is, for example, an SiO2 layer.

Next, the first hard mask layer 93 is machined by isotropic etching which uses the second hard mask layer 94 as a mask (FIG. 18B). As a result, the first hard mask layer 93 exposed in the opening 95 is isotropically recessed and a concave portion 96 is formed inside the first hard mask layer 93.

Next, the second hard mask layer 94 is removed (FIG. 18C). Next, the concave portion 96 of the first hard mask layer 93 is transferred to the substrate 51 by dry etching (FIG. 18D). As a result, the rear surface S2 of the substrate 51 is machined by dry etching and a concave portion having a shape similar to the concave portion 96 or, in other words, the concave lens 71 is formed on the rear surface S2 of the substrate 51.

As described above, the light-emitting apparatus 1 according to the present embodiment includes at least two types of lenses among the concave lens 71, the convex lens 72, and the flat lens 73 above the plurality of light-emitting elements 53. Therefore, according to the present embodiment, changing the type of lens to be used enables light from the light-emitting elements 53 to be shaped into light with a plurality of shapes.

In addition, the light-emitting apparatus 1 according to the present embodiment may include two or more types of concave lenses 71 with different shapes or two or more types of convex lenses 72 with different shapes above the plurality of light-emitting elements 53. Even in this case, changing the type of lens to be used enables light from the plurality of light-emitting elements 53 to be shaped into light with a plurality of shapes.

While the light-emitting apparatus 1 according to the present embodiment is used as a light source of a ranging apparatus, the light-emitting apparatus 1 may be used in other aspects. For example, the light-emitting apparatus 1 according to the present embodiment may be used as a light source of an optical device such as a printer or as a lighting apparatus.

While embodiments of the present disclosure have been described above, various modifications of the embodiments may be implemented without deviating from the gist of the present disclosure. For example, two or more embodiments may be combined and implemented.

The present disclosure can also be configured as follows.

(1)

A light-emitting apparatus, including:

a substrate;

a plurality of light-emitting elements which are provided on a side of a first surface of the substrate; and a plurality of first lenses which are provided on a side of a second surface of the substrate and on which light emitted from the plurality of light-emitting elements is incident, wherein the plurality of first lenses include at least two types of lenses among a concave lens, a convex lens, and a flat lens.

(2)

The light-emitting apparatus according to (1), further including a second lens on which light having passed through the plurality of first lenses is incident.

(3)

The light-emitting apparatus according to (1), wherein the plurality of first lenses are provided on the second surface of the substrate as a part of the substrate.

(4)

The light-emitting apparatus according to (1), wherein the plurality of light-emitting elements and the plurality of first lenses correspond to each other one-to-one, and light emitted from each light-emitting element is incident on a single corresponding first lens.

(5)

The light-emitting apparatus according to (1), further including a film which is provided on a surface of the concave lens and which has a flat or a convex surface on an opposite side to the concave lens.

(6)

The light-emitting apparatus according to (1), further including a film which is provided on a surface of the convex lens and which has a flat surface on an opposite side to the convex lens.

(7)

The light-emitting apparatus according to (1), further including an antireflective film which is provided on a surface of the plurality of first lenses.

(8)

The light-emitting apparatus according to (3), further including an inorganic film provided on the second surface of the substrate between the plurality of first lenses.

(9)

The light-emitting apparatus according to (1), wherein the substrate is a semiconductor substrate containing gallium (Ga) and arsenic (As).

(10)

The light-emitting apparatus according to (1), wherein light emitted from the plurality of light-emitting elements is transmitted inside the substrate from the first surface to the second surface and incident on the plurality of first lenses.

(11)

The light-emitting apparatus according to (1), wherein the first surface of the substrate is a front surface of the substrate and the second surface of the substrate is a rear surface of the substrate.

The light-emitting apparatus according to (1), further including a drive apparatus which is provided on the side of the first surface of the substrate via the plurality of light-emitting elements and which is configured to drive the plurality of light-emitting elements.

(13)

The light-emitting apparatus according to (12), wherein the drive apparatus is configured to drive the plurality of light-emitting elements on an individual basis.

(14)

A light-emitting apparatus, including:

a substrate;

a plurality of light-emitting elements which are provided on a side of a first surface of the substrate; and a plurality of first lenses which are provided on a side of a second surface of the substrate and on which light emitted from the plurality of light-emitting elements is incident, wherein the plurality of first lenses include a first concave lens and a second concave lens with a shape that differs from that of the first concave lens or include a first convex lens and a second convex lens with a shape that differs from that of the first convex lens.

(15)

A manufacturing method of a light-emitting apparatus, including the steps of forming a plurality of light-emitting elements on a side of a first surface of a substrate; and forming a plurality of first lenses on which light emitted from the plurality of light-emitting elements is incident on a side of a second surface of the substrate, wherein the plurality of first lenses include at least two types of lenses among a concave lens, a convex lens, and a flat lens.

(16)

The manufacturing method of a light-emitting apparatus according to (15), further including the step of arranging a second lens on which light having passed through the plurality of first lenses is incident.

(17)

The manufacturing method of a light-emitting apparatus according to (15), wherein the plurality of first lenses is formed as a part of the substrate by machining the second surface of the substrate.

(18)

The manufacturing method of a light-emitting apparatus according to (15), wherein the concave lens is formed by forming a convex portion on the second surface of the substrate and machining the convex portion into a concave portion.

(19)

The manufacturing method of a light-emitting apparatus according to (18), wherein the convex portion is formed by forming a resist film on the second surface of the substrate, patterning the resist film, baking the patterned resist film, and transferring a pattern of the baked resist film to the substrate.

(20)

The manufacturing method of a light-emitting apparatus according to (18), wherein the concave portion is formed by forming a mask layer on the convex portion, exposing the convex portion from the mask layer by etching the mask layer, and further etching the mask layer together with the convex portion.

(21)

The manufacturing method of a light-emitting apparatus according to (15), wherein the convex lens is formed by forming a convex portion on the second surface of the substrate.

(22)

The manufacturing method of a light-emitting apparatus according to (21), wherein the convex portion is formed by forming a resist film on the second surface of the substrate, patterning the resist film, baking the patterned resist film, and transferring a pattern of the baked resist film to the substrate.

(23)

The manufacturing method of a light-emitting apparatus according to (15), wherein the concave lens and the convex lens are formed by forming a film including a concave portion and a convex portion on the substrate and transferring the concave portion and the convex portion to the substrate.

(24)

A manufacturing method of a light-emitting apparatus, including the steps of forming a plurality of light-emitting elements on a side of a first surface of a substrate; and forming a plurality of first lenses on which light emitted from the plurality of light-emitting elements is incident on a side of a second surface of the substrate,
wherein
the plurality of first lenses include a first concave lens and a second concave lens with a shape that differs from that of the first concave lens or include a first convex lens and a second convex lens with a shape that differs from that of the first convex lens.

REFERENCE SIGNS LIST

1 Light-emitting apparatus
2 Imaging apparatus
3 Control apparatus
11 Light-emitting unit
12 Drive circuit
13 Power source circuit
14 Light-emitting side optical system
21 Image sensor
22 Image processing unit
23 Imaging-side optical system
31 Ranging unit
41 LD chip
42 LDD substrate
43 Mounting substrate
44 Heat dissipation substrate
45 Correcting lens holding unit
46 Correcting lens
47 Wiring
48 Bump
51 Substrate
52 Laminated film
53 Light-emitting element
54 Anode electrode
55 Cathode electrode
56 Embedded film
57 Protruding film
58 Coating film
61 Substrate 62 Connection pad
71 Concave lens
72 Convex lens
73 Flat lens
74 Antireflective film
75 Inorganic film
81 Mask layer
82 Mask layer
83 Resist film
84 Resist film
85 Convex portion
86 Hard mask layer
87 Concave portion
91 Hard mask layer
92 Opening
93 First hard mask layer
94 Second hard mask layer
95 Opening
96 Concave portion

The invention claimed is:

1. A light-emitting apparatus, comprising:
a substrate;
a plurality of light-emitting elements on a side of a first surface of the substrate, wherein each light-emitting element of the plurality of light-emitting elements is configured to emit light; and
a plurality of first lenses on a side of a second surface of the substrate, wherein
the light emitted from the plurality of light-emitting elements is incident on the plurality of first lenses, and
the plurality of first lenses includes a concave lens, a convex lens, and a flat lens.

2. The light-emitting apparatus according to claim 1, further comprising a second lens on which the light having passed through the plurality of first lenses is incident.

3. The light-emitting apparatus according to claim 1, wherein the plurality of first lenses is on the second surface of the substrate as a part of the substrate.

4. The light-emitting apparatus according to claim 3, further comprising an inorganic film on the second surface of the substrate between lenses of the plurality of first lenses.

5. The light-emitting apparatus according to claim 1, wherein
the each light-emitting element of the plurality of light-emitting elements corresponds to a respective first lens of the plurality of first lenses, and
the light emitted from the each light-emitting element of the plurality of light-emitting elements is incident on the respective first lens.

6. The light-emitting apparatus according to claim 1, further comprising a film on a surface of the concave lens, wherein the film has one of a flat surface or a convex surface on an opposite side to the concave lens.

7. The light-emitting apparatus according to claim 1, further comprising a film on a surface of the convex lens, wherein the film has a flat surface on an opposite side to the convex lens.

8. The light-emitting apparatus according to claim 1, further comprising an antireflective film on a surface of the plurality of first lenses.

9. The light-emitting apparatus according to claim 1, wherein the substrate is a semiconductor substrate containing gallium (Ga) and arsenic (As).

10. The light-emitting apparatus according to claim 1, wherein the light emitted from the plurality of light-emitting elements is transmitted inside the substrate from the first surface to the second surface and incident on the plurality of first lenses.

11. The light-emitting apparatus according to claim 1, wherein the first surface of the substrate is a front surface of the substrate and the second surface of the substrate is a rear surface of the substrate.

12. The light-emitting apparatus according to claim 1, further comprising a drive apparatus on the side of the first surface of the substrate via the plurality of light-emitting elements, wherein the drive apparatus is configured to drive the plurality of light-emitting elements.

13. The light-emitting apparatus according to claim 12, wherein the drive apparatus is configured to drive the plurality of light-emitting elements on an individual basis.

14. A light-emitting apparatus, comprising:

a substrate;

a plurality of light-emitting elements on a side of a first surface of the substrate, wherein each light-emitting element of the plurality of light-emitting elements is configured to emit light; and a plurality of first lenses on a side of a second surface of the substrate, wherein the light emitted from the plurality of light-emitting elements is incident on the plurality of first lenses, and the plurality of first lenses includes a flat lens, a first concave lens, and a second concave lens with a shape that differs from that of the first concave lens.

15. A manufacturing method of a light-emitting apparatus, the manufacturing method comprising:

forming a plurality of light-emitting elements on a side of a first surface of a substrate; and forming a plurality of first lenses on a side of a second surface of the substrate, wherein light emitted from the plurality of light-emitting elements is incident on the plurality of first lenses, and the plurality of first lenses includes a concave lens, a convex lens, and a flat lens.

16. The manufacturing method of the light-emitting apparatus according to claim 15, further comprising arranging a second lens on which the light having passed through the plurality of first lenses is incident.

17. The manufacturing method of the light-emitting apparatus according to claim 15, wherein the plurality of first lenses is formed as a part of the substrate by machining the second surface of the substrate.

18. The manufacturing method of the light-emitting apparatus according to claim 15, wherein the concave lens is formed by forming a convex portion on the second surface of the substrate and machining the convex portion into a concave portion.

19. The manufacturing method of the light-emitting apparatus according to claim 18, wherein the convex portion is formed by forming a resist film on the second surface of the substrate, patterning the resist film, baking the patterned resist film, and transferring a pattern of the baked resist film to the substrate.

20. The manufacturing method of the light-emitting apparatus according to claim 18, wherein the concave portion is formed by forming a mask layer on the convex portion, exposing the convex portion from the mask layer by etching the mask layer, and further etching the mask layer together with the convex portion.

21. The manufacturing method of the light-emitting apparatus according to claim 15, wherein the convex lens is formed by forming a convex portion on the second surface of the substrate.

22. The manufacturing method of the light-emitting apparatus according to claim 21, wherein the convex portion is formed by forming a resist film on the second surface of the substrate, patterning the resist film, baking the patterned resist film, and transferring a pattern of the baked resist film to the substrate.

23. The manufacturing method of the light-emitting apparatus according to claim 15, wherein the concave lens and the convex lens are formed by forming a film including a concave portion and a convex portion on the substrate and transferring the concave portion and the convex portion to the substrate.

24. A manufacturing method of a light-emitting apparatus, the manufacturing method comprising:

forming a plurality of light-emitting elements on a side of a first surface of a substrate; and forming a plurality of first lenses on a side of a second surface of the substrate, wherein light emitted from the plurality of light-emitting elements is incident on the plurality of first lenses, and the plurality of first lenses includes a flat lens, a first concave lens, and a second concave lens with a shape that differs from that of the first concave lens.

* * * * *